(12) United States Patent  (10) Patent No.: US 9,391,076 B1
Thompson et al.  (45) Date of Patent: Jul. 12, 2016

(54) CMOS STRUCTURES AND PROCESSES BASED ON SELECTIVE THINNING

(71) Applicant: MIE Fujitsu Semiconductor Limited, Kuwana (JP)

(72) Inventors: Scott E. Thompson, Gainesville, FL (US); Thomas Hoffmann, Los Gatos, CA (US); Lance Scudder, Sunnyvale, CA (US); Urupattur C. Sridharan, San Jose, CA (US); Dalong Zhao, San Jose, CA (US); Pushkar Ranade, Los Gatos, CA (US); Michael Duane, Santa Clara, CA (US); Paul Gregory, Palo Alto, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 0 days.

(21) Appl. No.: 14/574,896

(22) Filed: Dec. 18, 2014

Related U.S. Application Data

(60) Division of application No. 14/101,691, filed on Dec. 10, 2013, now abandoned, which is a continuation of application No. 13/591,767, filed on Aug. 22, 2012, now Pat. No. 8,614,128.

(60) Provisional application No. 61/526,635, filed on Aug. 23, 2011.

(51) Int. Cl.
*H01L 27/092* (2006.01)
*H01L 21/8238* (2006.01)
(Continued)

(52) U.S. Cl.
CPC ............ *H01L 27/0922* (2013.01); *H01L 27/11* (2013.01); *H01L 29/0653* (2013.01); *H01L 29/16* (2013.01)

(58) Field of Classification Search
CPC ................. H01L 21/823807; H01L 27/0922
USPC ........................................................ 438/275
See application file for complete search history.

(56) References Cited

U.S. PATENT DOCUMENTS 3,958,266 A  5/1976 Athanas
4,000,504 A  12/1976 Berger
(Continued)

FOREIGN PATENT DOCUMENTS

EP  0274278  7/1988
EP  0312237  4/1989
(Continued)

OTHER PUBLICATIONS

Abiko et al., "A channel engineering combined with channel epitaxy optimization and TED suppression for 0.15um n-n Gate CMOS Technology", Symposium on VLSI Technology Digest of Technical Papers (1995): 23-24.
(Continued)

*Primary Examiner* — Christine Enad
(74) *Attorney, Agent, or Firm* — Baker Botts L.L.P.

(57) ABSTRACT

Methods for fabricating semiconductor devices and devices therefrom are provided. A method includes providing a substrate having a semiconducting surface with first and second layers, where the semiconducting surface has a plurality of active regions comprising first and second active regions. In the first active region, the first layer is an undoped layer and the second layer is a highly doped screening layer. The method also includes removing a part of the first layer to reduce a thickness of the substantially undoped layer for at least a portion of the first active region without a corresponding thickness reduction of the first layer in the second active region. The method additionally includes forming semiconductor devices in the plurality of active regions. In the method, the part of the first layer removed is selected based on a threshold voltage adjustment required for the substrate in the portion of the first active region.

7 Claims, 12 Drawing Sheets

(51) Int. Cl.
    *H01L 27/11*     (2006.01)
    *H01L 29/16*     (2006.01)
    *H01L 29/06*     (2006.01)

(56) References Cited

U.S. PATENT DOCUMENTS

| | | |
|---|---|---|
| 4,021,835 A | 5/1977 | Etoh |
| 4,242,691 A | 12/1980 | Kotani |
| 4,276,095 A | 6/1981 | Beilstein, Jr. |
| 4,315,781 A | 2/1982 | Henderson |
| 4,518,926 A | 5/1985 | Swanson |
| 4,559,091 A | 12/1985 | Allen |
| 4,578,128 A | 3/1986 | Mundt |
| 4,617,066 A | 10/1986 | Vasudev |
| 4,662,061 A | 5/1987 | Malhi |
| 4,761,384 A | 8/1988 | Neppl |
| 4,780,748 A | 10/1988 | Cunningham |
| 4,819,043 A | 4/1989 | Yazawa |
| 4,885,477 A | 12/1989 | Bird |
| 4,908,681 A | 3/1990 | Nishida |
| 4,945,254 A | 7/1990 | Robbins |
| 4,956,311 A | 9/1990 | Liou |
| 5,034,337 A | 7/1991 | Mosher |
| 5,144,378 A | 9/1992 | Hikosaka |
| 5,156,989 A | 10/1992 | Williams |
| 5,156,990 A | 10/1992 | Mitchell |
| 5,166,765 A | 11/1992 | Lee |
| 5,208,473 A | 5/1993 | Komori |
| 5,294,821 A | 3/1994 | Iwamatsu |
| 5,298,763 A | 3/1994 | Shen |
| 5,369,288 A | 11/1994 | Usuki |
| 5,373,186 A | 12/1994 | Schubert |
| 5,384,476 A | 1/1995 | Nishizawa |
| 5,426,328 A | 6/1995 | Yilmaz |
| 5,444,008 A | 8/1995 | Han |
| 5,552,332 A | 9/1996 | Tseng |
| 5,559,368 A | 9/1996 | Hu |
| 5,608,253 A | 3/1997 | Liu |
| 5,622,880 A | 4/1997 | Burr |
| 5,624,863 A | 4/1997 | Helm |
| 5,625,568 A | 4/1997 | Edwards |
| 5,641,980 A | 6/1997 | Yamaguchi |
| 5,663,583 A | 9/1997 | Matloubian |
| 5,712,501 A | 1/1998 | Davies |
| 5,719,422 A | 2/1998 | Burr |
| 5,726,488 A | 3/1998 | Watanabe |
| 5,726,562 A | 3/1998 | Mizuno |
| 5,731,626 A | 3/1998 | Eaglesham |
| 5,736,419 A | 4/1998 | Naem |
| 5,753,555 A | 5/1998 | Hada |
| 5,754,826 A | 5/1998 | Gamal |
| 5,756,365 A | 5/1998 | Kakumu |
| 5,763,921 A | 6/1998 | Okumura |
| 5,780,899 A | 7/1998 | Hu |
| 5,847,419 A | 12/1998 | Imai |
| 5,856,003 A | 1/1999 | Chiu |
| 5,861,334 A | 1/1999 | Rho |
| 5,877,049 A | 3/1999 | Liu |
| 5,885,876 A | 3/1999 | Dennen |
| 5,889,315 A | 3/1999 | Farrenkopf |
| 5,895,954 A | 4/1999 | Yasumura |
| 5,899,714 A | 5/1999 | Farrenkopf |
| 5,918,129 A | 6/1999 | Fulford, Jr. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning |
| 6,001,695 A | 12/1999 | Wu |
| 6,020,227 A | 2/2000 | Bulucea |
| 6,043,139 A | 3/2000 | Eaglesham |
| 6,060,345 A | 5/2000 | Hause |
| 6,060,364 A | 5/2000 | Maszara |
| 6,066,533 A | 5/2000 | Yu |
| 6,072,217 A | 6/2000 | Burr |
| 6,078,082 A | 6/2000 | Bulucea |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son |
| 6,121,153 A | 9/2000 | Kikkawa |
| 6,147,383 A | 11/2000 | Kuroda |
| 6,153,920 A | 11/2000 | Gossmann |
| 6,157,073 A | 12/2000 | Lehongres |
| 6,175,582 B1 | 1/2001 | Naito |
| 6,184,112 B1 | 2/2001 | Maszara |
| 6,190,979 B1 | 2/2001 | Radens |
| 6,194,259 B1 | 2/2001 | Nayak |
| 6,198,157 B1 | 3/2001 | Ishida |
| 6,218,892 B1 | 4/2001 | Soumyanath |
| 6,218,895 B1 | 4/2001 | De |
| 6,221,724 B1 | 4/2001 | Yu |
| 6,229,188 B1 | 5/2001 | Aoki |
| 6,232,164 B1 | 5/2001 | Tsai |
| 6,235,597 B1 | 5/2001 | Miles |
| 6,238,982 B1 | 5/2001 | Krivokapic |
| 6,245,618 B1 | 6/2001 | An |
| 6,268,640 B1 | 7/2001 | Park |
| 6,271,070 B2 | 8/2001 | Kotani |
| 6,271,551 B1 | 8/2001 | Schmitz |
| 6,288,429 B1 | 9/2001 | Iwata |
| 6,297,132 B1 | 10/2001 | Zhang |
| 6,300,177 B1 | 10/2001 | Sundaresan |
| 6,313,489 B1 | 11/2001 | Letavic |
| 6,319,799 B1 | 11/2001 | Ouyang |
| 6,320,222 B1 | 11/2001 | Forbes |
| 6,323,525 B1 | 11/2001 | Noguchi |
| 6,326,666 B1 | 12/2001 | Bernstein |
| 6,335,233 B1 | 1/2002 | Cho |
| 6,358,806 B1 | 3/2002 | Puchner |
| 6,380,019 B1 | 4/2002 | Yu |
| 6,391,752 B1 | 5/2002 | Colinge |
| 6,426,260 B1 | 7/2002 | Hshieh |
| 6,426,279 B1 | 7/2002 | Huster |
| 6,432,754 B1 | 8/2002 | Assaderaghi |
| 6,444,550 B1 | 9/2002 | Hao |
| 6,444,551 B1 | 9/2002 | Ku |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall |
| 6,482,714 B1 | 11/2002 | Hieda |
| 6,489,224 B1 | 12/2002 | Burr |
| 6,492,232 B1 | 12/2002 | Tang |
| 6,500,739 B1 | 12/2002 | Wang |
| 6,503,801 B1 | 1/2003 | Rouse |
| 6,503,805 B2 | 1/2003 | Wang |
| 6,506,640 B1 | 1/2003 | Ishida |
| 6,518,623 B1 | 2/2003 | Oda |
| 6,521,470 B1 | 2/2003 | Lin |
| 6,534,373 B1 | 3/2003 | Yu |
| 6,541,328 B2 | 4/2003 | Whang |
| 6,541,829 B2 | 4/2003 | Nishinohara |
| 6,548,842 B1 | 4/2003 | Bulucea |
| 6,551,885 B1 | 4/2003 | Yu |
| 6,552,377 B1 | 4/2003 | Yu |
| 6,573,129 B2 | 6/2003 | Hoke |
| 6,576,535 B2 | 6/2003 | Drobny |
| 6,600,200 B1 | 7/2003 | Lustig |
| 6,620,671 B1 | 9/2003 | Wang |
| 6,624,488 B1 | 9/2003 | Kim |
| 6,627,473 B1 | 9/2003 | Oikawa |
| 6,630,710 B1 | 10/2003 | Augusto |
| 6,660,605 B1 | 12/2003 | Liu |
| 6,662,350 B2 | 12/2003 | Fried |
| 6,667,200 B2 | 12/2003 | Sohn |
| 6,670,260 B1 | 12/2003 | Yu |
| 6,693,333 B1 | 2/2004 | Yu |
| 6,730,568 B2 | 5/2004 | Sohn |
| 6,737,724 B2 | 5/2004 | Hieda |
| 6,743,291 B2 | 6/2004 | Ang |

(56) References Cited

U.S. PATENT DOCUMENTS

| | | |
|---|---|---|
| 6,743,684 B2 | 6/2004 | Liu |
| 6,751,519 B1 | 6/2004 | Satya |
| 6,753,230 B2 | 6/2004 | Sohn |
| 6,760,900 B2 | 7/2004 | Rategh |
| 6,770,944 B2 | 8/2004 | Nishinohara |
| 6,787,424 B1 | 9/2004 | Yu |
| 6,797,553 B2 | 9/2004 | Adkisson |
| 6,797,602 B1 | 9/2004 | Kluth |
| 6,797,994 B1 | 9/2004 | Hoke |
| 6,808,004 B2 | 10/2004 | Kamm |
| 6,808,994 B1 | 10/2004 | Wang |
| 6,813,750 B2 | 11/2004 | Usami |
| 6,821,825 B2 | 11/2004 | Todd |
| 6,821,852 B2 | 11/2004 | Rhodes |
| 6,822,297 B2 | 11/2004 | Nandakumar |
| 6,831,292 B2 | 12/2004 | Currie |
| 6,835,639 B2 | 12/2004 | Rotondaro |
| 6,852,602 B2 | 2/2005 | Kanzawa |
| 6,852,603 B2 | 2/2005 | Chakravarthi |
| 6,881,641 B2 | 4/2005 | Wieczorek |
| 6,881,987 B2 | 4/2005 | Sohn |
| 6,891,439 B2 | 5/2005 | Jaehne |
| 6,893,947 B2 | 5/2005 | Martinez |
| 6,900,519 B2 | 5/2005 | Cantell |
| 6,901,564 B2 | 5/2005 | Stine |
| 6,916,698 B2 | 7/2005 | Mocuta |
| 6,917,237 B1 | 7/2005 | Tschanz |
| 6,927,463 B2 | 8/2005 | Iwata |
| 6,928,128 B1 | 8/2005 | Sidiropoulos |
| 6,930,007 B2 | 8/2005 | Bu |
| 6,930,360 B2 | 8/2005 | Yamauchi |
| 6,957,163 B2 | 10/2005 | Ando |
| 6,963,090 B2 | 11/2005 | Passlack |
| 6,995,397 B2 | 2/2006 | Yamashita |
| 7,002,214 B1 | 2/2006 | Boyd |
| 7,008,836 B2 | 3/2006 | Algotsson |
| 7,013,359 B1 | 3/2006 | Li |
| 7,015,546 B2 | 3/2006 | Herr |
| 7,015,741 B2 | 3/2006 | Tschanz |
| 7,022,559 B2 | 4/2006 | Barnak |
| 7,036,098 B2 | 4/2006 | Eleyan |
| 7,038,258 B2 | 5/2006 | Liu |
| 7,039,881 B2 | 5/2006 | Regan |
| 7,045,456 B2 | 5/2006 | Murto |
| 7,057,216 B2 | 6/2006 | Ouyang |
| 7,061,058 B2 | 6/2006 | Chakravarthi |
| 7,064,039 B2 | 6/2006 | Liu |
| 7,064,399 B2 | 6/2006 | Babcock |
| 7,071,103 B2 | 7/2006 | Chan |
| 7,078,325 B2 | 7/2006 | Curello |
| 7,078,776 B2 | 7/2006 | Nishinohara |
| 7,089,513 B2 | 8/2006 | Bard |
| 7,089,515 B2 | 8/2006 | Hanafi |
| 7,091,093 B1 | 8/2006 | Noda |
| 7,105,399 B1 | 9/2006 | Dakshina-Murthy |
| 7,109,099 B2 | 9/2006 | Tan |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch |
| 7,169,675 B2 | 1/2007 | Tan |
| 7,170,120 B2 | 1/2007 | Datta |
| 7,176,137 B2 | 2/2007 | Perng |
| 7,186,598 B2 | 3/2007 | Yamauchi |
| 7,189,627 B2 | 3/2007 | Wu |
| 7,199,430 B2 | 4/2007 | Babcock |
| 7,202,517 B2 | 4/2007 | Dixit |
| 7,208,354 B2 | 4/2007 | Bauer |
| 7,211,871 B2 | 5/2007 | Cho |
| 7,221,021 B2 | 5/2007 | Wu |
| 7,223,646 B2 | 5/2007 | Miyashita |
| 7,226,833 B2 | 6/2007 | White |
| 7,226,843 B2 | 6/2007 | Weber |
| 7,230,680 B2 | 6/2007 | Fujisawa |
| 7,235,822 B2 | 6/2007 | Li |
| 7,256,639 B1 | 8/2007 | Koniaris |
| 7,259,428 B2 | 8/2007 | Inaba |
| 7,260,562 B2 | 8/2007 | Czajkowski |
| 7,294,877 B2 | 11/2007 | Rueckes |
| 7,297,994 B2 | 11/2007 | Wieczorek |
| 7,301,208 B2 | 11/2007 | Handa |
| 7,304,350 B2 | 12/2007 | Misaki |
| 7,307,471 B2 | 12/2007 | Gammie |
| 7,312,500 B2 | 12/2007 | Miyashita |
| 7,323,754 B2 | 1/2008 | Ema |
| 7,332,439 B2 | 2/2008 | Lindert |
| 7,348,629 B2 | 3/2008 | Chu |
| 7,354,833 B2 | 4/2008 | Liaw |
| 7,380,225 B2 | 5/2008 | Joshi |
| 7,398,497 B2 | 7/2008 | Sato |
| 7,402,207 B1 | 7/2008 | Besser |
| 7,402,872 B2 | 7/2008 | Murthy |
| 7,416,605 B2 | 8/2008 | Zollner |
| 7,427,788 B2 | 9/2008 | Li |
| 7,442,971 B2 | 10/2008 | Wirbeleit |
| 7,449,733 B2 | 11/2008 | Inaba |
| 7,462,908 B2 | 12/2008 | Bol |
| 7,469,164 B2 | 12/2008 | Du-Nour |
| 7,470,593 B2 | 12/2008 | Rouh |
| 7,485,536 B2 | 2/2009 | Jin |
| 7,487,474 B2 | 2/2009 | Ciplickas |
| 7,491,988 B2 | 2/2009 | Tolchinsky |
| 7,494,861 B2 | 2/2009 | Chu |
| 7,496,862 B2 | 2/2009 | Chang |
| 7,496,867 B2 | 2/2009 | Turner |
| 7,498,637 B2 | 3/2009 | Yamaoka |
| 7,501,324 B2 | 3/2009 | Babcock |
| 7,503,020 B2 | 3/2009 | Allen |
| 7,507,999 B2 | 3/2009 | Kusumoto |
| 7,514,766 B2 | 4/2009 | Yoshida |
| 7,521,323 B2 | 4/2009 | Surdeanu |
| 7,531,393 B2 | 5/2009 | Doyle |
| 7,531,836 B2 | 5/2009 | Liu |
| 7,538,364 B2 | 5/2009 | Twynam |
| 7,538,412 B2 | 5/2009 | Schulze |
| 7,562,233 B1 | 7/2009 | Sheng |
| 7,564,105 B2 | 7/2009 | Chi |
| 7,566,600 B2 | 7/2009 | Mouli |
| 7,569,456 B2 | 8/2009 | Ko |
| 7,586,322 B1 | 9/2009 | Xu |
| 7,592,241 B2 | 9/2009 | Takao |
| 7,595,243 B1 | 9/2009 | Bulucea |
| 7,598,142 B2 | 10/2009 | Ranade |
| 7,605,041 B2 | 10/2009 | Ema |
| 7,605,060 B2 | 10/2009 | Meunier-Beillard |
| 7,605,429 B2 | 10/2009 | Bernstein |
| 7,608,496 B2 | 10/2009 | Chu |
| 7,615,802 B2 | 11/2009 | Elpelt |
| 7,622,341 B2 | 11/2009 | Chudzik |
| 7,638,380 B2 | 12/2009 | Pearce |
| 7,642,140 B2 | 1/2010 | Bae |
| 7,644,377 B1 | 1/2010 | Saxe |
| 7,645,665 B2 | 1/2010 | Kubo |
| 7,651,920 B2 | 1/2010 | Siprak |
| 7,655,523 B2 | 2/2010 | Babcock |
| 7,673,273 B2 | 3/2010 | Madurawe |
| 7,675,126 B2 | 3/2010 | Cho |
| 7,675,317 B2 | 3/2010 | Perisetty |
| 7,678,638 B2 | 3/2010 | Chu |
| 7,681,628 B2 | 3/2010 | Joshi |
| 7,682,887 B2 | 3/2010 | Dokumaci |
| 7,683,442 B1 | 3/2010 | Burr |
| 7,696,000 B2 | 4/2010 | Liu |
| 7,704,822 B2 | 4/2010 | Jeong |
| 7,704,844 B2 | 4/2010 | Zhu |
| 7,709,828 B2 | 5/2010 | Braithwaite |
| 7,723,750 B2 | 5/2010 | Zhu |
| 7,737,472 B2 | 6/2010 | Kondo |
| 7,741,138 B2 | 6/2010 | Cho |
| 7,741,200 B2 | 6/2010 | Cho |
| 7,745,270 B2 | 6/2010 | Shah |
| 7,750,374 B2 | 7/2010 | Capasso |
| 7,750,381 B2 | 7/2010 | Hokazono |
| 7,750,405 B2 | 7/2010 | Nowak |

(56) References Cited

U.S. PATENT DOCUMENTS

| | | |
|---|---|---|
| 7,750,682 B2 | 7/2010 | Bernstein |
| 7,755,144 B2 | 7/2010 | Li |
| 7,755,146 B2 | 7/2010 | Helm |
| 7,759,206 B2 | 7/2010 | Luo |
| 7,759,714 B2 | 7/2010 | Itoh |
| 7,761,820 B2 | 7/2010 | Berger |
| 7,795,677 B2 | 9/2010 | Bangsaruntip |
| 7,808,045 B2 | 10/2010 | Kawahara |
| 7,808,410 B2 | 10/2010 | Kim |
| 7,811,873 B2 | 10/2010 | Mochizuki |
| 7,811,881 B2 | 10/2010 | Cheng |
| 7,818,702 B2 | 10/2010 | Mandelman |
| 7,821,066 B2 | 10/2010 | Lebby |
| 7,829,402 B2 | 11/2010 | Matocha |
| 7,831,873 B1 | 11/2010 | Trimberger |
| 7,846,822 B2 | 12/2010 | Seebauer |
| 7,855,118 B2 | 12/2010 | Hoentschel |
| 7,859,013 B2 | 12/2010 | Chen |
| 7,863,163 B2 | 1/2011 | Bauer |
| 7,867,835 B2 | 1/2011 | Lee |
| 7,883,977 B2 | 2/2011 | Babcock |
| 7,888,205 B2 | 2/2011 | Herner |
| 7,888,747 B2 | 2/2011 | Hokazono |
| 7,895,546 B2 | 2/2011 | Lahner |
| 7,897,495 B2 | 3/2011 | Ye |
| 7,906,413 B2 | 3/2011 | Cardone |
| 7,906,813 B2 | 3/2011 | Kato |
| 7,910,419 B2 | 3/2011 | Fenouillet-Beranger |
| 7,919,791 B2 | 4/2011 | Flynn |
| 7,926,018 B2 | 4/2011 | Moroz |
| 7,935,984 B2 | 5/2011 | Nakano |
| 7,941,776 B2 | 5/2011 | Majumder |
| 7,945,800 B2 | 5/2011 | Gomm |
| 7,948,008 B2 | 5/2011 | Liu |
| 7,952,147 B2 | 5/2011 | Ueno |
| 7,960,232 B2 | 6/2011 | King |
| 7,960,238 B2 | 6/2011 | Kohli |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell |
| 7,989,900 B2 | 8/2011 | Haensch |
| 7,994,573 B2 | 8/2011 | Pan |
| 8,004,024 B2 | 8/2011 | Furukawa |
| 8,012,827 B2 | 9/2011 | Yu |
| 8,029,620 B2 | 10/2011 | Kim |
| 8,039,332 B2 | 10/2011 | Bernard |
| 8,046,598 B2 | 10/2011 | Lee |
| 8,048,791 B2 | 11/2011 | Hargrove |
| 8,048,810 B2 | 11/2011 | Tsai |
| 8,051,340 B2 | 11/2011 | Cranford, Jr. |
| 8,053,340 B2 | 11/2011 | Colombeau |
| 8,063,466 B2 | 11/2011 | Kurita |
| 8,067,279 B2 | 11/2011 | Sadra |
| 8,067,280 B2 | 11/2011 | Wang |
| 8,067,302 B2 | 11/2011 | Li |
| 8,076,719 B2 | 12/2011 | Zeng |
| 8,097,529 B2 | 1/2012 | Krull |
| 8,103,983 B2 | 1/2012 | Agarwal |
| 8,105,891 B2 | 1/2012 | Yeh |
| 8,106,424 B2 | 1/2012 | Schruefer |
| 8,106,481 B2 | 1/2012 | Rao |
| 8,110,487 B2 | 2/2012 | Griebenow |
| 8,114,761 B2 | 2/2012 | Mandrekar |
| 8,119,482 B2 | 2/2012 | Bhalla |
| 8,120,069 B2 | 2/2012 | Hynecek |
| 8,129,246 B2 | 3/2012 | Babcock |
| 8,129,797 B2 | 3/2012 | Chen |
| 8,134,159 B2 | 3/2012 | Hokazono |
| 8,143,120 B2 | 3/2012 | Kerr |
| 8,143,124 B2 | 3/2012 | Challa |
| 8,143,678 B2 | 3/2012 | Kim |
| 8,148,774 B2 | 4/2012 | Mori |
| 8,163,619 B2 | 4/2012 | Yang |
| 8,169,002 B2 | 5/2012 | Chang |
| 8,170,857 B2 | 5/2012 | Joshi |
| 8,173,499 B2 | 5/2012 | Chung |
| 8,173,502 B2 | 5/2012 | Yan |
| 8,176,461 B1 | 5/2012 | Trimberger |
| 8,178,430 B2 | 5/2012 | Kim |
| 8,178,959 B2 | 5/2012 | Lopez et al. |
| 8,179,530 B2 | 5/2012 | Levy |
| 8,183,096 B2 | 5/2012 | Wirbeleit |
| 8,183,107 B2 | 5/2012 | Mathur |
| 8,185,865 B2 | 5/2012 | Gupta |
| 8,187,959 B2 | 5/2012 | Pawlak |
| 8,188,542 B2 | 5/2012 | Yoo |
| 8,196,545 B2 | 6/2012 | Kurosawa |
| 8,201,122 B2 | 6/2012 | Dewey, III |
| 8,214,190 B2 | 7/2012 | Joshi |
| 8,217,423 B2 | 7/2012 | Liu |
| 8,225,255 B2 | 7/2012 | Ouyang |
| 8,227,307 B2 | 7/2012 | Chen |
| 8,236,661 B2 | 8/2012 | Dennard |
| 8,239,803 B2 | 8/2012 | Kobayashi |
| 8,247,300 B2 | 8/2012 | Babcock |
| 8,255,843 B2 | 8/2012 | Chen |
| 8,258,026 B2 | 9/2012 | Bulucea |
| 8,266,567 B2 | 9/2012 | El Yahyaoui |
| 8,286,180 B2 | 10/2012 | Foo |
| 8,288,798 B2 | 10/2012 | Passlack |
| 8,299,562 B2 | 10/2012 | Li |
| 8,324,059 B2 | 12/2012 | Guo |
| 2001/0014495 A1 | 8/2001 | Yu |
| 2002/0042184 A1 | 4/2002 | Nandakumar |
| 2003/0006415 A1 | 1/2003 | Yokogawa |
| 2003/0047763 A1 | 3/2003 | Hieda |
| 2003/0122203 A1 | 7/2003 | Nishinohara |
| 2003/0173626 A1 | 9/2003 | Burr |
| 2003/0183856 A1 | 10/2003 | Wieczorek |
| 2003/0215992 A1 | 11/2003 | Sohn |
| 2004/0075118 A1 | 4/2004 | Heinemann |
| 2004/0075143 A1 | 4/2004 | Bae |
| 2004/0084731 A1 | 5/2004 | Matsuda |
| 2004/0087090 A1 | 5/2004 | Grudowski |
| 2004/0126947 A1 | 7/2004 | Sohn |
| 2004/0175893 A1 | 9/2004 | Vatus |
| 2004/0180488 A1 | 9/2004 | Lee |
| 2005/0106824 A1 | 5/2005 | Alberto |
| 2005/0116282 A1 | 6/2005 | Pattanayak |
| 2005/0133819 A1 | 6/2005 | Kawasaki |
| 2005/0250289 A1 | 11/2005 | Babcock |
| 2005/0280075 A1 | 12/2005 | Ema |
| 2006/0022270 A1 | 2/2006 | Boyd |
| 2006/0049464 A1 | 3/2006 | Rao |
| 2006/0068555 A1 | 3/2006 | Zhu |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock |
| 2006/0203581 A1 | 9/2006 | Joshi |
| 2006/0220114 A1 | 10/2006 | Miyashita |
| 2006/0223248 A1 | 10/2006 | Venugopal |
| 2007/0040222 A1 | 2/2007 | Van Camp |
| 2007/0117326 A1 | 5/2007 | Tan |
| 2007/0158790 A1 | 7/2007 | Rao |
| 2007/0212861 A1 | 9/2007 | Chidambarrao |
| 2007/0238253 A1 | 10/2007 | Tucker |
| 2008/0067589 A1 | 3/2008 | Ito |
| 2008/0108208 A1 | 5/2008 | Arevalo |
| 2008/0169493 A1 | 7/2008 | Lee |
| 2008/0169516 A1 | 7/2008 | Chung |
| 2008/0197439 A1 | 8/2008 | Goerlach |
| 2008/0227250 A1 | 9/2008 | Ranade |
| 2008/0237661 A1 | 10/2008 | Ranade |
| 2008/0258198 A1 | 10/2008 | Bojarczuk |
| 2008/0272409 A1 | 11/2008 | Sonkusale |
| 2009/0057746 A1 | 3/2009 | Sugll |
| 2009/0108350 A1 | 4/2009 | Cai |
| 2009/0134468 A1 | 5/2009 | Tsuchiya |
| 2009/0224319 A1 | 9/2009 | Kohli |
| 2009/0283842 A1* | 11/2009 | Hokazono ............... 257/392 |
| 2009/0302388 A1 | 12/2009 | Cai |
| 2009/0309140 A1 | 12/2009 | Khamankar |

(56) References Cited

U.S. PATENT DOCUMENTS

| | | | |
|---|---|---|---|
| 2009/0311837 A1 | 12/2009 | Kapoor | |
| 2009/0321849 A1 | 12/2009 | Miyamura | |
| 2010/0012988 A1 | 1/2010 | Yang | |
| 2010/0038724 A1 | 2/2010 | Anderson | |
| 2010/0100856 A1 | 4/2010 | Mittal | |
| 2010/0148153 A1 | 6/2010 | Hudait | |
| 2010/0149854 A1 | 6/2010 | Vora | |
| 2010/0155854 A1 | 6/2010 | Stahrenberg et al. | |
| 2010/0187641 A1 | 7/2010 | Zhu | |
| 2010/0207182 A1 | 8/2010 | Paschal | |
| 2010/0270600 A1 | 10/2010 | Inukai | |
| 2011/0059588 A1 | 3/2011 | Kang | |
| 2011/0073961 A1 | 3/2011 | Dennard | |
| 2011/0074498 A1 | 3/2011 | Thompson | |
| 2011/0079860 A1 | 4/2011 | Verhulst | |
| 2011/0079861 A1 | 4/2011 | Shifren | |
| 2011/0095811 A1 | 4/2011 | Chi | |
| 2011/0147828 A1 | 6/2011 | Murthy | |
| 2011/0169082 A1 | 7/2011 | Zhu | |
| 2011/0175170 A1 | 7/2011 | Wang | |
| 2011/0180880 A1 | 7/2011 | Chudzik | |
| 2011/0193164 A1 | 8/2011 | Zhu | |
| 2011/0212590 A1 | 9/2011 | Wu | |
| 2011/0230039 A1 | 9/2011 | Mowry | |
| 2011/0242921 A1 | 10/2011 | Tran | |
| 2011/0248352 A1 | 10/2011 | Shifren | |
| 2011/0294278 A1 | 12/2011 | Eguchi | |
| 2011/0309447 A1 | 12/2011 | Arghavani | |
| 2012/0021594 A1 | 1/2012 | Gurtej | |
| 2012/0034745 A1 | 2/2012 | Colombeau | |
| 2012/0056275 A1 | 3/2012 | Cai | |
| 2012/0065920 A1 | 3/2012 | Nagumo | |
| 2012/0108050 A1 | 5/2012 | Chen | |
| 2012/0132998 A1 | 5/2012 | Kwon | |
| 2012/0138953 A1* | 6/2012 | Cai et al. | 257/77 |
| 2012/0146155 A1 | 6/2012 | Hoentschel | |
| 2012/0167025 A1 | 6/2012 | Gillespie | |
| 2012/0187491 A1 | 7/2012 | Zhu | |
| 2012/0190177 A1 | 7/2012 | Kim | |
| 2012/0223363 A1 | 9/2012 | Kronholz | |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | 2011062788 | 5/2011 |
| WO | WO2011/062788 | 5/2011 |

OTHER PUBLICATIONS

Banerjee et al., "Compensating non-optical effects using electrically-driven optical proximity correction", Proc of SPIE (2009) 7275: 7275OE.

Chau et al., "A 50nm depleted-substrate CMOS transistor (DST)", IEEE International Electron Device Meeting (2001): 29.1.1-29.1.4.

Cheng et al., "Extremely thin SOI (ETSOI) CMOS with record low variability for low power system-on-chip applications", Electron Devices Meeting (IEDM) (Dec. 2009).

Cheng et al., "Fully depleted extremely thin SOI technology fabricated by a novel integrated scheme featuring implant-free, sero-silicon-loss and faceted raised source/drain", Symposium on VLSI Technology Digest of Technical Papers (2009): 212-213.

Drennan et al., "Implication of proximity effects for analog design", Custom Integrated Circuits Conference (Sep. 2006): 169-176.

Ducroquet et al., "Fully depleted silicon-on-insulator nMOSFETs with tensile strained high carbon content Si1-yCy channel", ECS 210th Meeting. Abstract 1033.

Ernst et al., "Nanoscaled MOSFET transistors on strained Si, SiGe, Ge Layers: Some integration and electrical properties features", ECS Trans (2006) 3(7): 947-961.

Goesele et al., "Diffusion engineering by carbon in silicon", Mat Res Soc Symp. vol. 610.

Hokazono et al., "Steep channel & halo profiles utilizing Boron-diffusion-barrier layers (Si:) for 32 nm node and beyond", Symposium on VLSI Technology Digest of Technical Papers (2008): 112-113.

Hokazono et al., "Steep channel profiles in n/pMOS controlled by Boron-doped SiC: Layers for continual bulk-CMOS scaling", IEDM09-676 Symposium: 29.1.1-29.1.4.

Holland et al., "A method to improve activation of implanted dopants in SiC", Oak Ridge National Laboratory, Oak Ridge, TN. (9 pages).

Hook et al., "Lateral ion implant straggle and mask proximity effect", IEEE Transactions on Electron Devices (Sep. 2003) 50(9): 1946-1951.

Hori et al., "A 0.1 um CMOS with a step channel profile formed by ultra high vacuum CVD and in-situ doped ions", Proceeding of the International Electron Devices Meeting (Dec. 5, 1993): 909-911.

Komaragiri et al., "Depletion-free poly gate electrode architecture for Sub 100 nanometer CMOS devices with high-K gate dielectrics", IEEE IEDM Tech Dig, San Francisco, CA (Dec. 13-15, 2004): 833-836.

Kotaki et al., "Novel bulk dynamic threshold voltage MOSFET (B-DTMOS) with isolation (SITOS) and gate to shallow-well contact (SSS-C) processes for ultra low power dual gate CMOS", IEDM (1996): 459-462.

Laveant, "Incorporation, diffusion and agglomeration of carbon in silicon", Solid State Phenomena (2002) 82-84: 189-194.

Matashuashi et al., "High-performance double-layer epitaxial-channel PMOSFET compatible with a single gate CMOSFET", Symposium on VLSI Technology Digest of Technical Papers (1996): 36-37.

Noda et al., "An 0.1-μm delta-doped MOSFET fabricated with post-low-energy implanting selective epitaxy", IEEE Transactions on Electron Devices (1998) 45(4): 809-814.

Ohguro et al., "An 0.18-μm CMOS for mixed digital and analog application with zero-volt-VTH epitaxial-channel MOSFET's", IEEE Transaction on Electron Devices (1999) 46(7): 1378-1383.

Pinacho et al., "Carbon in silicon: Modeling of diffusion and clustering mechanisms", Journal of Applied Physics (2002) 92(3): 1582-1588.

Robertson et al., "The effect of impurities on diffusion and activation of ion implanted boron in silicon", Mat Res Soc Symp (2000) 610: B5.8.1-B5.8.6.

Samsudin et al., "Integrating intrinsic parameter fluctuation description into BSIMSOI to forecast sub-15um UTB SOI based 6T SRAM operation", Solid-State Electronics 52: 86-93.

Scholz et al., "Carbon-induced undersaturation of silicon self-interstitials", Appl Phys Lett (1998) 72(2): 200-202.

Scholz et al., "The contribution of vacancies to carbon out-diffusion in silicon", Appl Phys Lett (1999) 74(3): 392-394.

Shao et al., "Boron diffusion in silicon: The anomalies and control by point defect engineering", Materials Science and Engineering R: Reports (Nov. 2012) 42(3-4): 65-114.

Sheu et al., "Modeling the well-edge proximity effect in highly scaled MOSFETs", IEEE Transactions on Electron Devices (Nov. 2006) 53(11): 2792-2798.

Stolk et al., "Physical mechanism of transient enhanced dopant diffusion in ion-implanted silicon", J Appl Phys (1997) 81(9): 6031-6050.

Thompson et al., "MOS Scaling: Transistor challenges for the 21st Century", Intel Technology Journal Q3 (1998): 1-19.

Wann et al., "Channel profile optimization and device design for low-power high-performance dynamic-threshold MOSFET", IEDM (1996): 113-116.

Werner et al., "Carbon diffusion in silicon", Applied Physics Letters (1998) 73(17): 2465-2467.

Wong et al., "Nanoscale CMOS", Proceedings of the IEEE. 87(4): 537-570.

(56) References Cited

OTHER PUBLICATIONS

Yan et al., "Scaling the Si MOSFET: From bulk to SOI to bulk", IEEE Transactions on Electron Devices (1992) 39(7): 1704-1710.
Werner, P. et al., "Carbon Diffusion in Silicon," Applied Physics Letters, vol. 73, No. 17, pp. 2465-2467, Oct. 1998.
Yan, Ran-Hong et al., "Scaling the Si MOSFET: From Bulk to SOI to Bulk," IEEE Transactions on Electron Devices, vol. 39, No. 7', Jul. 1992.
Abiko, H. et al., "A Channel Engineering Combined with Channel Epitaxy Optimization and RED Suppression for 0.15µm n-n Gate CMOS Technology." 1995 Symposium on VLSI Technology Digest of Technical Papers, pp. 23-24, 1995.
Chau, R. et al., "A 50nm Depleted-Substrate CMOS Transistor (DST)", Electron Device Meeting 2001, IEDM Technical Digest, IEEE International, pp. 29.1.1-29.1.4, 2001.
Ducroquet, F. et al. "Fully Depleted Silicon-On Insulator nMOSFETs with Tensile Strained High Carbon Content Sil-yCy Channel", ECS 210th Meeting, Abstract 1033, 2006.
Ernst, T. et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.
Goesele, U. et al., "Diffusion Engineering by Carbon in Silicon", Mat. Res. Soc. Symp. vol. 610, pp. 1-12, 2000.
Hokazono, A. et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.
Hokazono, A. et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.
Holland, OW and Thomas, DK "A Method to Improve Activation of Implanted Dopants in SiC", Oak Ridge National Laboratory, Oak Ridge, TN, pp. 1-9, 2001.
Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.
Lavéant, P. "Incorporation, Diffusion and Agglomeration of Carbon in Silicon", Solid State Phenomena, vols. 82-84, pp. 189-194, 2002.
Noda, K. et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.
Ohguro, T. et al., "An 0.18-µm CMOS for Mixed Digital and Analog Applications with Zero-Volt-Vth Epitaxial-Channel MOSFET's", IEEE Transactions on Electron Devices, vol. 46, No. 7, pp. 1378-1383, Jul. 1999.
Pinacho, R. et al., "Carbon in Silicon: Modeling of Diffusion and Clustering Mechanisms", Journal of Applied Physics, vol. 92, No. 3, pp. 1582-1588, Aug. 2002.
Robertson, LS et al., "The Effect of Impurities on Diffusion and Activation of Ion Implanted Boron in Silicon", Mat. Res. Soc. Symp. vol. 610, 2000.
Scholz, R. et al., "Carbon-Induced Undersaturation of Silicon Self-Interstitials", Appl. Phys. Lett. 72(2), pp. 200-202, Jan. 1998.
Scholz, RF et al., "The Contribution of Vacancies to Carbon Out-Diffusion in Silicon", Appl. Phys. Lett., vol. 74, No. 3, pp. 392-394, Jan. 1999.
Stolk, PA et al., "Physical Mechanisms of Transient Enhanced Dopant Diffusion in Ion-Implanted Silicon", J. Appl. Phys. 81(9), pp. 6031-6050, May 1997.
Thompson, S. et al., "MOS Scaling: Transistor Challenges for the 21st Century", Intel Technology Journal Q3' 1998, pp. 1-19, 1998.
Wann, C., et al., "Channel Profile Optimization and Device Design for Low-Power High-Performance Dynamic Threshold MOSFET", IEDM 96, pp. 113-116, 1996.
Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.
Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.
Wong, H et al., "Nanoscale CMOS", Proceedings of the IEEE, Vo. 87, No. 4, pp. 537-570, Apr. 1999.
Banerjee, et al. "Compensating Non-Optical Effects using Electrically-Driven Optical Proximity Correction", Proc. of SPIE vol. 7275 7275OE, 2009.
Cheng, et al. "Extremely Thin Soi (ETSOI) CMOS with Record Low Variability for Low Power System-on-Chip Applications", Electron Devices Meeting (IEDM), Dec. 2009.
Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.
Drennan, et al. "Implications of Proximity Effects for Analog Design", Custom Integrated Circuits Conference, pp. 169-176, Sep. 2006.
Hook, et al. "Lateral Ion Implant Straggle and Mask Proximity Effect", IEEE Transactions on Electron Devices, vol. 50, No. 9, pp. 1946-1951, Sep. 2003.
Hori, et al., "A 0.1 µm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.
Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.
Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.
Sheu, et al. "Modeling the Well-Edge Proximity Effect in Highly Scaled MOSFETs", IEEE Transactions on Electron Devices, vol. 53, No. 11, pp. 2792-2798, Nov. 2006.

* cited by examiner

|   | Vt spec (mV) | 3.3V DDC Devices, 25nm Epi | | 3.3V DDC Devices, 30nm Epi | |
|---|---|---|---|---|---|
|   |   | Vt | Result | Vt | Result |
| N | 0.5 | 0.713 | Vt too high | 0.51 | in spec |
| P | 0.5 | 0.695 | Vt too high | 0.46 | in spec |

|   | Vt spec Vt | 1.8V DDC Devices, 25nm Epi | | 1.8V DDC Devices, 30nm Epi | |
|---|---|---|---|---|---|
|   |   | Vt | Result | Vt | Result |
| N | 0.5 | 0.606 | Vt too high | 0.48 | in spec |
| P | 0.5 | 0.601 | Vt too high | 0.47 | in spec |

|   | Vt spec Vt | 0.9V DDC Devices, 25nm Epi | | 0.9V DDC Devices, 30nm Epi | |
|---|---|---|---|---|---|
|   |   | Vt | Result | Vt | Result |
| N | 0.4 | 0.399 | in spec | 0.289 | Vt too low |
| P | 0.6 | 0.599 | in spec | 0.530 | Vt too low |

CMOS STRUCTURES AND PROCESSES BASED ON SELECTIVE THINNING

CROSS-REFERENCE TO RELATED APPLICATION

This application is a divisional of U.S. Non-Provisional application Ser. No. 14/101,691 which is a continuation of U.S. Non-Provisional application Ser. No. 13/591,767, filed Aug. 22, 2012, which claims priority to U.S. Provisional Patent Application No. 61/526,635, filed Aug. 23, 2011 and entitled "Scaled CMOS Structures and Processes", the contents of which are hereby incorporated by reference in their entirety.

FIELD

The present invention relates to methods for fabricating integrated circuit structures.

BACKGROUND

Widespread use of mobile or low power electronics has created a need for high performance integrated circuits capable of operation at subvolt (<1 volt) levels. Many attempts have been made to develop new transistor architectures with high performance, low operating voltage, and low leakage. For example, there has been significant research regarding the use of silicon on insulator (SOI) and three dimensional fin (multigate) transistors. However, such integrated circuit designs are typically incompatible with much of the existing fabrication and design infrastructure.

Further exacerbating the problems regarding the fabrication of subvolt transistor devices is that many integrated circuit designs now call for a variety of devices to be formed therein. For example, it is not uncommon for a circuit design to include subvolt transistor devices to be concurrently formed with other devices on a same integrated circuit die, such as high power transistors and analog devices. In addition to these different devices having different requirements for performance, these devices are also typically associated with different fabrication conditions to achieve this performance. In some instances, these different fabrication conditions can conflict with each other. Accordingly, in order to ensure sufficient yield of operable devices in such cases, a compromise between the fabrication and performance of the subvolt devices and the other devices is typically required. For example, in many designs, the performance requirements are relaxed in order to allow selection of conditions that allow for the fabrication of the subvolt devices and other devices on a same substrate, conditions that are often suboptimal. As a result, even though there may be a high yield of operable devices, the performance of the subvolt device, the other devices, or both, may be degraded in such integrated circuit die.

BRIEF DESCRIPTION OF THE DRAWINGS

FIG. 6 shows different exemplary specifications for NMOS and PMOS for analog 3.3V devices, analog 1.8V devices, and 0.9V logic devices;

DETAILED DESCRIPTION

Figure 1:
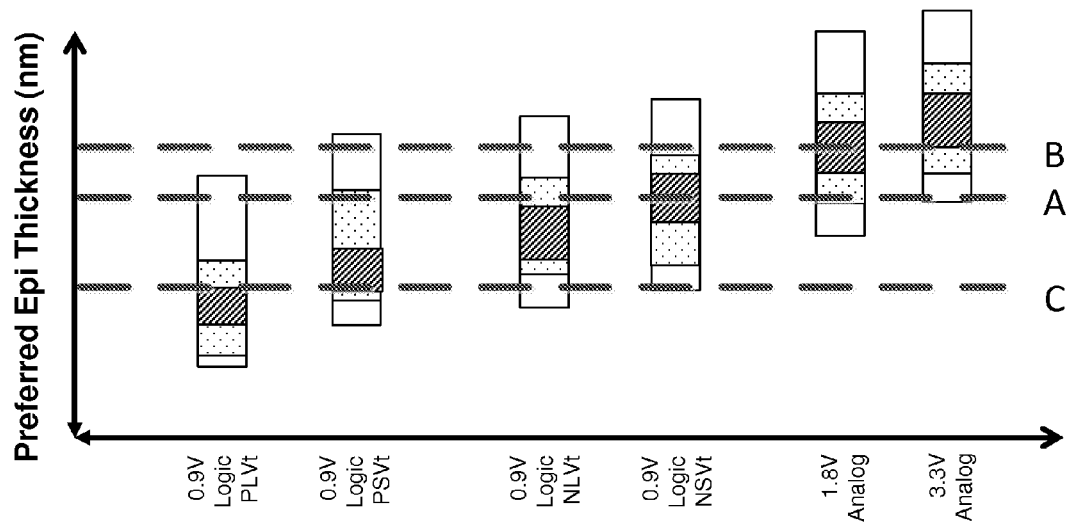
FIG. 1 is a plot showing exemplary performance of different types of devices as a function of epitaxial layer thickness.

Embodiments are described with reference to the attached figures, wherein like reference numerals are used throughout the figures to designate similar or equivalent elements. The figures are not drawn to scale and they are provided merely to illustrate the embodiments. It should be understood that numerous specific details, relationships, and methods are set forth to provide a full understanding of the embodiments. One having ordinary skill in the relevant art, however, will readily recognize that embodiments can be practiced without one or more of the specific details or with other methods. In other instances, well-known structures or operations are not shown in detail to avoid obscuring the embodiments. Embodiments are not limited by the illustrated ordering of acts or events, as some acts may occur in different orders and/or concurrently with other acts or events. Furthermore, not all illustrated acts or events are required to implement a methodology in accordance with the present invention.

Digital and analog transistors have been available in decreasing sizes over time, with transistor channel lengths that formerly were tens of thousands of nanometers being reduced a thousand-fold to a hundred nanometers or less in length. However, maintaining transistor quality and electrical characteristics for such downwardly scaled transistors is difficult at nanometer scales, and can even be more difficult for supporting circuits requiring low threshold voltage transistors. This is particularly true for mixed signal die that support both analog and digital transistors, and include a mixture of high and low voltage threshold voltage transistors.

One particular difficulty in such mixed signal die and other die (collectively "mixed device die") including a combination of subvolt devices and other devices is the fabrication of the range of devices. That is, for transistors especially with gate lengths in the sub-nanometer range, it is not only generally difficult to provide a multitude of devices operating reliably and with low substrate leakages, but it can be particularly difficult to form such devices consistently across a substrate. One solution for supporting a range of transistor device types while providing acceptable performance of the devices is to configure the channels of the transistors to provide deeply depleted channel (DDC) transistors. The incorporation of DDC for forming a plurality of device types across multiple mixed die that operate in a substantially consistent manner.

DDC transistors are formed, for example, by implanting dopants into a well for the CMOS devices to form a heavily doped screen layer ($10^{18}$ to $10^{20}$ atoms/cm$^3$). This may be followed by an undoped or slightly doped (collectively "substantially undoped") blanket epitaxial layer (<5×10$^{17}$) deposited over the screen layer(s), extending across multiple die and transistor die blocks. Such a blanket epitaxial layer should be formed so as to reduce upward migration of scattered dopants emplaced during the screen layer implants. In some configurations, lightly doped threshold voltage (Vth) adjustment layers (between 5×10$^{17}$ and 2×10$^{19}$ atoms/cm$^3$) can also be formed in or adjacent to the screen layer in order to allow finer adjustment of threshold voltage and control against unwanted leakage current. Preferably, conventional threshold voltage setting methods by way of channel implants or halo implants are not used in the fabrication of DDC transistors. However, other various embodiments exist.

Details regarding exemplary DDC transistor structures and manufacturing processes are more completely described in U.S. patent application Ser. No. 12/708,497 titled "ELECTRONIC DEVICES AND SYSTEMS, AND METHODS FOR MAKING AND USING THE SAME" and filed Feb. 18, 2010, U.S. patent application Ser. No. 12/971,884 titled "LOW POWER SEMICONDUCTOR TRANSISTOR STRUCTURE AND METHOD OF FABRICATION THEREOF" and filed Dec. 17, 2010, U.S. patent application Ser. No. 12/971,955 titled "TRANSISTOR WITH THRESHOLD VOLTAGE SET NOTCH AND METHOD OF FABRICATION THEREOF" and filed Dec. 17, 2010, U.S. patent application Ser. No. 12/895,785 titled "ADVANCED TRANSISTORS WITH THRESHOLD VOLTAGE SET DOPANT STRUCTURES" and filed Sep. 30, 2010, the disclosures of which are hereby incorporated by reference in their entirety, and U.S. patent application Ser. No. 12/895,813 titled "ADVANCED TRANSISTORS WITH PUNCH THROUGH SUPPRESSION" and filed Sep. 30, 2010.

For DDC devices, epitaxial layer thickness above the Vth setting layer and screen layer influences the threshold voltage setting of the device. Specifically, a thicker epitaxial layer tends to result in a lower Vth, while a thinner epitaxial layer tends result in a higher Vth. Although, screen implant conditions and Vth implant conditions, such as dose and energy, can also affect Vth value, the epitaxial layer thickness remains a modulator for the Vth value as well. If a process flow as described above is used, then, all DDC devices have substantially the same blanket epitaxial layer thickness. This method for implementation of DDC devices is effective to control fabrication costs for building working devices and circuits, but all devices sharing a common epitaxial layer thickness may be suboptimal for many of the devices. This is illustrated with respect to FIG. 1.

FIG. 1 is a plot showing exemplary tolerances of epitaxial layer thicknesses for the operation of different types of devices defined by Vth settings. The digital devices depicted in FIG. 1 presume a supply voltage of 0.9V. The analog devices depicted in FIG. 1 presume supply voltage of 1.8V and 3.3 V, respectively. The preferred epitaxial layer thickness ranges for digital devices are shown for PMOS DDC low Vth devices (PLVt), PMOS DDC standard Vth devices (PSVt), NMOS DDC low Vth devices (NLVt), NMOS DDC standard Vth devices (NSVt), as well as for low power (1.8V) analog DDC devices and high power (3.3V) analog DDC devices. The ranges illustrated in FIG. 1 are presented solely for illustrative purposes for a given power specification and fabrication process. Actual device implementations may result in different variations from the epitaxial layer thickness ranges illustrated in FIG. 1. For instance, such device implementations may result in a larger or smaller amount of overlap among the epitaxial layer thickness ranges than illustrated in FIG. 1

For each type of DDC devices in FIG. 1, three epitaxial layer thickness ranges are shown. The first range (hatched fill) represents the range of epitaxial layer thickness for the device in which optimal performance is obtained ("sweet spot"). The second range (dotted fill) represents the range of epitaxial layer thicknesses in which a low level of operational degradation is observed. This low level of degradation would likely result in operable devices but with less than desired speed, or leakage. The third range (solid fill) represents the range in which a high degree of operational degradation is observed. This high degree of degradation would likely result in degradation of yield or additional leakage and speed degradation for operable devices. Outside such ranges, the device performance would be severely degraded, possibly to the point that little or no devices would be operable within the desired operational window.

In view of the foregoing, the effects of selecting a single common epitaxial layer thickness can be observed. For example, the different dashed lines (A, B, C) in FIG. 1 represent different epitaxial layer thicknesses. As can be observed from FIG. 1, it may be possible to select an epitaxial layer thickness in which all of the devices are within at least one of the three ranges (see line A). However, only some devices would be in the second or third ranges, meaning that the operational performance of many of the devices would be degraded. Alternatively, the epitaxial layer thickness could be selected to target a particular device's performance. However, this can result in other devices falling outside the three ranges. For example, as shown in FIG. 1, if the epitaxial layer thickness is selected for optimization of the analog devices (line B), the PSVt, NSVt, and NLVt devices would be in the third range, resulting in their degraded operational performance. Even worse, the PLVt devices would be operating outside the ranges, potentially resulting in inoperability of these devices. Conversely, setting the epitaxial layer thickness to target the PLVt and PSVt devices (line C) would cause the NSVt and NLVt devices to be in the third range, resulting in their degraded operational performance and the analog devices to be outside the ranges, resulting in the potential inoperability of these devices.

In view of the potential difficulties in using a single epitaxial layer thickness adequate for multiple types of DDC devices in a mixed device die, the various embodiments described below are directed to a process flow for forming mixed DDC device die that addresses these difficulties by utilizing selective thinning of epitaxial layers. The term "selective thinning" as used herein with respect to epitaxial layers (or any other type of layer covering over the heavily doped regions of the DDC device) refers to any process that reduces a thickness of the epitaxial layer in a selected device or local portion of the mixed device die without a corresponding reduction of the thickness of the epitaxial layer in other portions of the die.

The selective thinning of the various embodiments provides a process flow, and devices therefrom, that improves DDC device and circuit benefits. Most notably, the various embodiments provide a way to achieve reliable Vth values for devices via selective etching without relying on modulation of screen implants, modulation or addition of other implants, or any combinations thereof. Locally removing as little as 1 nm of the epitaxial layer in a DDC device can result in a large (20-30 mV) shift in Vth. Accordingly, this allows significant adjustments in Vth by removing selected amounts preferably between 1 nm and 10 nm, such as between 1 nm and 5 nm, in lieu of adjusting implant conditions or other channel process parameters. Accordingly, the various embodiments enable the different devices in a mixed device die to be designed and fabricated with epitaxial layer thicknesses at or near their corresponding sweet spot (or other desired operation point), rather than forcing all devices to use a common epitaxial layer thickness. The results of such a process on the exemplary device configuration of FIG. 1 are illustrated with respect to FIG. 2.

Although the various embodiments will be primarily described in terms of modifying Vth by adjusting epitaxial layer thickness through selecting thinning, the various embodiments are not limited in this regard. Rather, variations in epitaxial layer thickness strongly correlate to variations in other device characteristics, such as leakage current, sub-threshold swing, and drain-induced barrier lowering, to name a few. Accordingly, while in some embodiments, the epitaxial layer thickness can be selected to target a specific Vth, in other embodiments, the epitaxial layer thickness can be selected to target specific values of other device characteristics.

Figure 2:
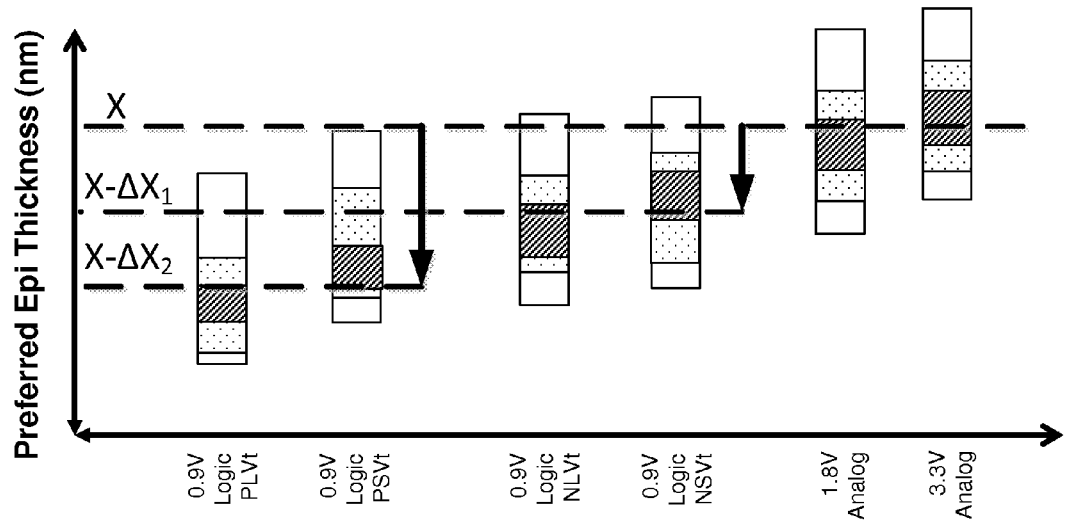
FIG. 2 shows the plot of performance versus epitaxial layer thickness of FIG. 1 and further illustrates the effect of selective thinning.

FIG. 2 shows the plot of performance versus epitaxial layer thickness of FIG. 1 and further illustrates the effect of selective thinning. One exemplary process in accordance with the various embodiments can involve selecting the epitaxial layer thickness based on the sweet spot of devices associated with the thickest epitaxial layer and thereafter locally and selectively thinning the epitaxial layer to provide epitaxial layer thicknesses for devices having a sweet spot associated with thinner epitaxial layer thickness. For example, as shown in FIG. 2, an epitaxial layer can be initially formed, with a thickness targeted for the analog devices (X). However, in the example of FIG. 2, the NMOS devices require a thinner epitaxial layer thickness (X-$\Delta X_1$) and the PMOS devices require an even thinner epitaxial layer thickness (X-$\Delta X_2$). Accordingly, in one embodiment, the local and selective thinning of the epitaxial layer can be performed in the NMOS regions to provide improved epitaxial layer thickness for the NMOS devices, and then additional local selective thinning can be applied in the PMOS regions to provide improved epitaxial layer thickness for the PMOS devices.

Although at least some thinning of the epitaxial layer in both of the PMOS and NMOS areas can be performed concurrently, the present disclosure also contemplates that the thinning of each device type can also be performed separately. That is, thinning of epitaxial layers for PMOS is performed in one step and thinning of epitaxial layers for NMOS is performed in a different step. Once the epitaxial layer has been appropriately thinned in the various areas of the mixed device die, processing can then continue to form the devices on the resulting epitaxial layer. As a result, DDC devices are provided in each of the NMOS, PMOS, and analog device areas with epitaxial layer thicknesses in their respective sweet spots.

It should be noted that the present disclosure is not limited to selective thinning of epitaxial layers for NMOS, PMOS, and analog devices, nor is the disclosure limited to epitaxial layer per se. The present disclosure contemplates that there may be a layer of another type of material over a doped region, wherein the selective thinning of the material will modulates the effect of the doped region on the device. Selective thinning can be performed for any type of device on the mixed device die. Further, the present disclosure also contemplates that different devices can also have the same epitaxial layer thickness. Accordingly, the present disclosure contemplates embodiments including one or more selective thinning steps of processes depending on the number of different device types and the amount of overlap (or lack thereof) of their performance/epitaxial layer thickness ranges.

It should be further noted that although the example above contemplates selecting epitaxial layer thicknesses based on devices' respective sweet spots, the various embodiments are not limited in this regard. Indeed, the overall performance requirements of the mixed device die usually tolerate the epitaxial layers thickness falling into a different target from the sweet spot for at least some of the devices. The present disclosure contemplates embodiments in which selective thinning is utilized only for certain devices.

The setting of the Vth by way of selective thinning of the epitaxial layer can be performed as follows. First, the DDC devices are formed through the step of the formation of the screen/Vth setting doped region, that is, the step prior to the deposition of the epitaxial layer. The doping level is selected for the different devices, to set a Vth matched to a given epitaxial thickness. If ion implantation is used to dope the screen/Vth setting region, then the implant dose and energy levels are selected to achieve the desired doping concentration and implanted depth of the doped region. Then, the epitaxial layer is formed to a pre-selected thickness that corresponds to devices associated with the thickest epitaxial layer so as to set the Vth value for such devices. Then, for those devices requiring a thinner epitaxial layer to set the Vth value, then for those devices, the epitaxial layer is etched back to a targeted thinness amenable for achieving the desired Vth value. The selective thinning can be performed using any type of material removal process allowing for a degree of control of amount of material to be etched. In the various embodiments, a removal process can consist of a single step in which material is removed from the epitaxial layer, such as directly etching of the epitaxial layer using a dry etch process or a wet etch process. The selective etching of the epitaxial layer can happen either before or after STI formation, but needs to be completed before gate oxide formation.

Although a removal process in accordance with the various embodiments can be configured for removing all of the material in a single etch process step, the present disclosure contemplates utilizing other processes to provide a greater degree of control. In some embodiments, multiple steps are used. Multiple etch process steps that each remove a pre-defined amount of material can be used. In other embodiments a combination of a limited transformation process and an etch process can be utilized. In such a process, a portion of the epitaxial layer is first transformed. For example, the portion of the epitaxial layer to be removed is first amorphized, oxidized, or otherwise transformed into a material with different properties from the epitaxial layer, down to a selected depth. The transformation process can be selected so that the depth can be accurately selected and controlled. For example, the transformation process can be a self-limiting process that removes only a pre-defined amount of material, regardless of the length of the process. Thereafter, the transformed material is removed in a second step by way of selective etching of the transformed material. That is, a etch process is utilized that preferentially etches the transformed material over the material of the epitaxial layer.

The removal process used for selective thinning of a particular area of the substrate can depend on the amount of thinning and the amount of variability allowed for the thinned epitaxial layer. For example, a greater degree of control is warranted when reducing the epitaxial layer thickness by 1 nm as compared to 5 nm or 10 nm.

Some exemplary selective epitaxial layer removal processes are provided below. In all examples, the thickness areas that are to be shielded from the removal process are masked using an effective material, for instance, a photoresist layer, a hard mask, or combination thereof. The open areas are to be thinned by exposure to the removal process. In a first example, the removal process can consist of silicon oxidation and subsequent removal by etching, such as an in-situ steam generated oxide or chemical oxidation to form a native oxide layer followed by HF:H$_2$0 etch. In a second example, the process can consist of dry plasma etch using chemistries that effectively remove a predictable amount of silicon, for instance, fluorine-based chemistries. In a third example, a non-plasma, vapor-based etch can be used to remove a predictable amount of silicon, for instance, chlorine-based vapor. In still another example, a silicon wet etch can be used, such as one based on HNO$_3$ and HF. However, the various embodiments are not limited to these removal processes and other processes are equally applicable.

In some embodiments, where the amount of selective thinning needs to be controlled precisely, a self-limiting process can be used. For example, a low temperature oxidation such as ISSG can be used, which can be self-limiting to stop at a selected thickness by proper recipe condition selection, followed by dry or wet oxide removal. Another technique could be a chemical oxidation process, such as SC1, followed by dry or wet oxide removal.

Now turning to FIGS. 3A-3I, an exemplary process flow is shown for providing selective epitaxial layer thinning in accordance with the various embodiments. The process flow can begin with the formation of the screen layer, Vth offsetting region, and other implants for the NMOS devices in a well substrate. As shown in the exemplary flow of FIG. 3A, this involves providing a substrate, and implanting material therein. Although a bulk-silicon substrate is contemplated for the embodiment, other types of substrates can be used, including, but not limited to, N-type substrates, SOI substrates, and epi-type substrates.

Figure 3A:
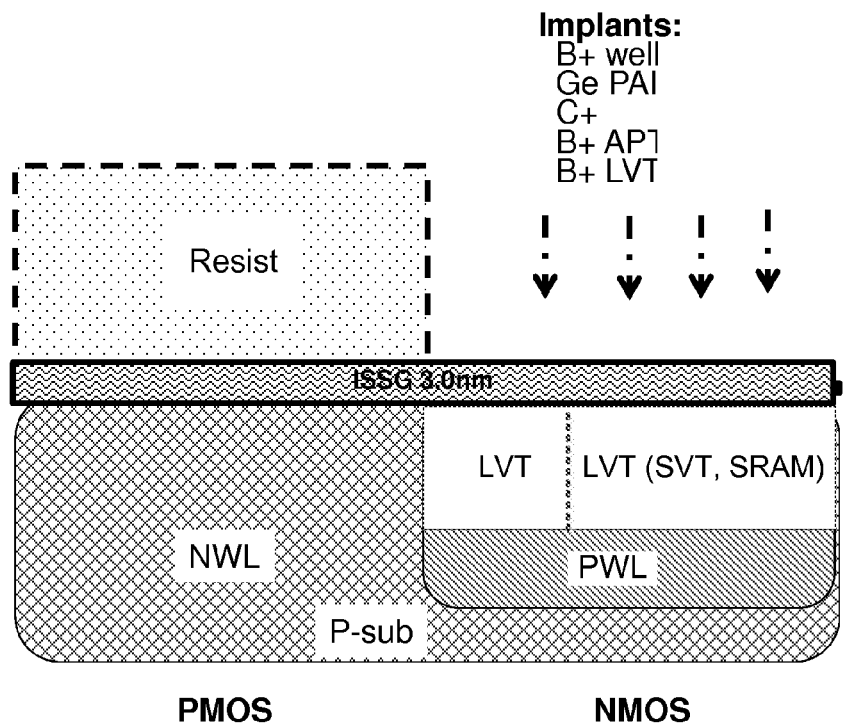
FIGS. 3A-3I show an exemplary process flow for providing selective epitaxial layer thinning in accordance with the various embodiments.

The NMOS screen layers can be formed via a process that includes formation of a patterned mask layer to prevent dopants from being implanted into other regions of the substrate. For example, as illustrated in FIG. 3A, the masking layer shown as covering the N-well devices, can be formed by providing a layer of photoresist which is patterned with openings to expose the regions of the substrate associated with the NMOS devices. However, the various embodiments are not limited in this regard and the masking layer can be formed using a hard mask layer, alone or in combination with photoresist. Such a hard mask layer can be formed using layers of silicon oxide, silicon nitride, or any other suitable hard mask layers. Optionally, as shown in FIG. 3A, a sacrificial protective oxide layer can be formed prior to the formation of the photoresist or other masking layers. Such a layer can be an in situ steam generated (ISSG) layer or any other type of sacrificial oxide layer sufficient to protect the substrate from unwanted effects of the ion implantation. Appropriate implants, such as P-type conductivity implants, are then provided according to the types of the devices to be formed. For example, as illustrated in FIG. 3A, first blanket implants can be provided to define screen layers for NLVt, NSVt, and NMOS SRAM devices.

For instance, the process may begin with a Boron (B) well-implant at about 120 keV to 140 keV at a dose of about $1 \times 10^{13}$ to $1 \times 10^{15}$ atoms/cm$^2$. A germanium (Ge) pre-amorphization implant may be used at an energy of about 20 keV to 60 keV at a dose of about $1 \times 10^{13}$ to $1 \times 10^{15}$ atoms/cm$^2$, followed by a carbon (C) implant at about 2 keV to 7 keV at a dose of about $1 \times 10^{13}$ to $1 \times 10^{15}$ atoms/cm$^2$, with recrystallization, to prevent movement of the Boron implanted atoms. The device implants include Boron anti-punchthrough at an energy of about 10 keV to 30 keV at a dose of about $5 \times 10^{12}$ to $1 \times 10^{14}$ atoms/cm$^2$, as well as a blanket DDC Boron implant to simultaneously begin formation of the LVt, SVt and SRAM devices at an energy of about 2 keV to 10 keV at a dose of about $1 \times 10^{13}$ to $1 \times 10^{14}$ atoms/cm$^2$. At the end of this initial set of implants, the dopants for the LVt devices will be in place, as indicated by the "LVT" regions in FIG. 3A. At this point in the process flow, the areas associated with the SVt and SRAM devices, indicated by "(SVT)" and "(SRAM)" respectively in FIG. 3A will also have dopants in place for LVt devices.

In FIG. 3A and the subsequent figures, each of the areas for LVt, SVt, and SRAM devices are shown as adjacent or adjoining areas in the P-type well ("PWL"). This is solely for ease of illustration and description. In the various embodiments, the implants for the areas shown in FIGS. 3A-3I may be separated each other. These areas can be separated by forming mask layers that define one or more of these regions separately.

Figure 3B:
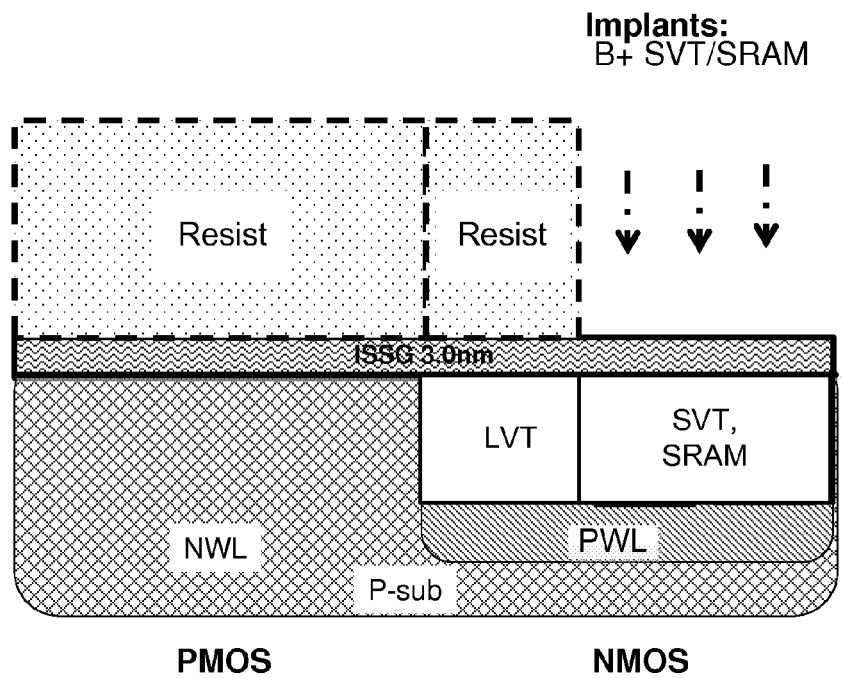

Variations in energy, material, and dose for one or more of the implants discussed above may be applied depending on the specifications from the device design. Further, the implant conditions discussed above are presented solely for purposes of illustration and not by way of limitation. In the various embodiments, more or less implants can be used. Alternatively stated, other implants, other than those listed in FIG. 3A, can be utilized as well. Following the completion of the implants discussed above, additional patterned mask layers are formed to provide additional implants to build out the various devices. For example, as illustrated in FIG. 3B, the NLVt region can be masked off to allow for the NSVt and NMOS SRAM regions to receive additional screen implants to increase the Vth for those devices. The doses and energies are selected to result in a targeted concentration of dopants and depth of doped region to provide a Vth value for a given thickness of epitaxial layer. For instance, additional Boron may be implanted at an energy between about 2 keV to 10 keV at a dose of about $1 \times 10^{12}$ to $1 \times 10^{14}$ atoms/cm$^2$. Though not shown, the NSVt region can also be masked off to allow for the NMOS SRAM to receive still further screen implants. However, the various embodiments are not limited to this particular configuration, and the implant conditions may vary as needed to meet the Vth requirements for the device design. The implant conditions for the additional screen implants discussed are provided solely for illustrative purposes. Any suitable set of implants can be used in the various embodiments.

Figure 3C:
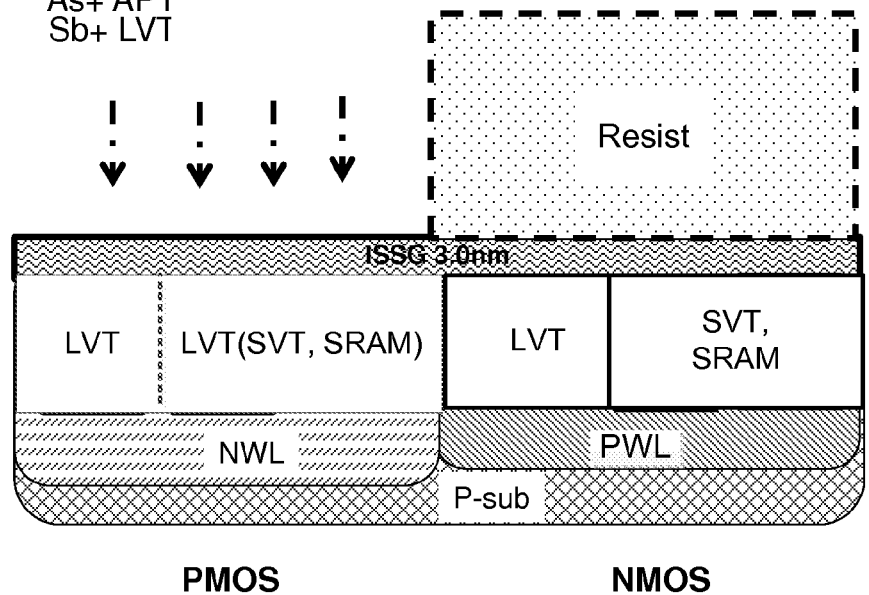

Once the implants for the NMOS regions are completed, all of the NMOS devices are covered over with a mask so that the doped regions for the PMOS regions can be formed. For example, as shown in FIG. 3C, with the NMOS devices effectively masked off, the PMOS devices can be formed. In the process illustrated in FIG. 3C, the devices are also formed by ion implantation. For instance, the process may begin with a Phosphorous well-implant at about 200 keV to 450 keV at a dose of about $5 \times 10^{12}$ to $5 \times 10^{14}$ atoms/cm$^2$. The device implants include Arsenic anti-punchthrough at an energy of about 50 keV to 200 keV at a dose of about $5 \times 10^{12}$ to $1 \times 10^{14}$ atoms/cm$^2$, as well as a blanket DDC Antimony implant to simultaneously begin formation of the LVT, SVT and SRAM devices at an energy of about 5 keV to 30 keV at a dose of about $1 \times 10^{12}$ to $1 \times 10^{14}$ atoms/cm$^2$. Variations of energies, materials and doses may apply depending on the specifications from the device design.

Figure 3D:
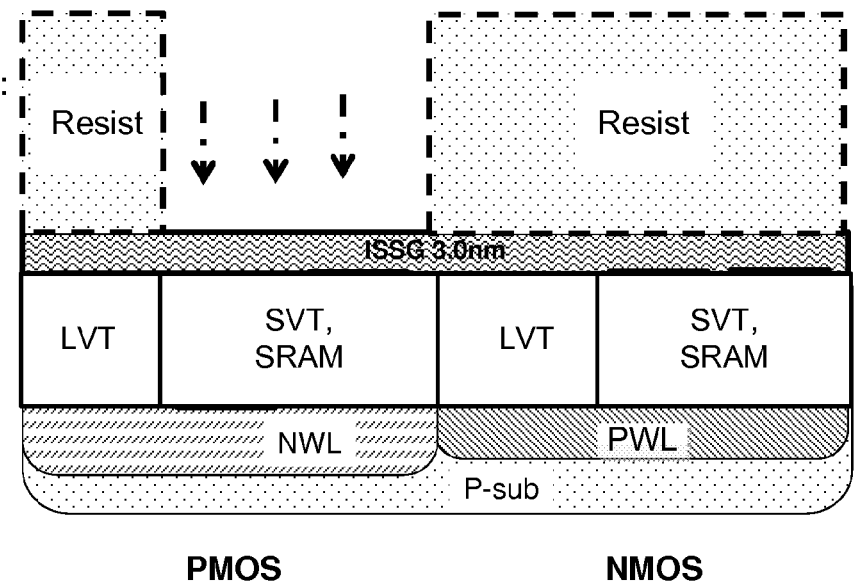

Then, additional patterned mask layers can be formed to cover devices to be protected to allow for additional screening implants to be performed for the more heavily concentrated devices, the SVT and SRAM, as illustrated in FIG. 3D. For instance, additional Antimony may be implanted at an energy of about 5 keV to 30 keV at a dose of about $1 \times 10^{12}$ to $5 \times 10^{13}$ atoms/cm$^2$. The doses and energies are selected to result in a targeted concentration of dopants and depth of doped region to provide a Vth value for a given thickness of epitaxial layer. Though not shown, the PSVt region can then be masked off to allow for the PMOS SRAM to receive still further screening implant. The particular implant materials and conditions provided and the mask patterns presented are provided solely for purposes of illustration and are not intended to limit the various embodiments in any regard.

Figure 3E:
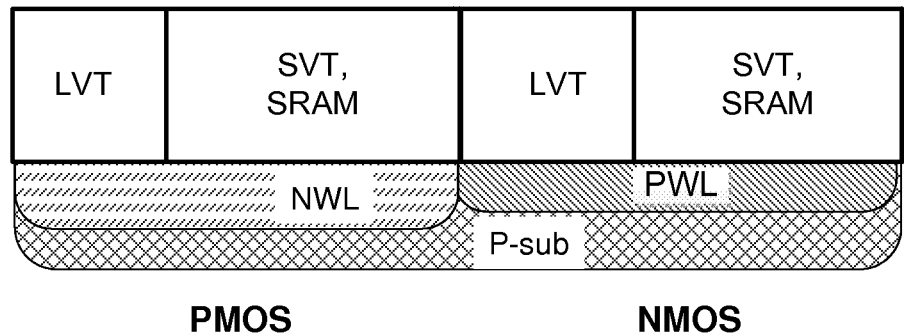
Figure 3F:
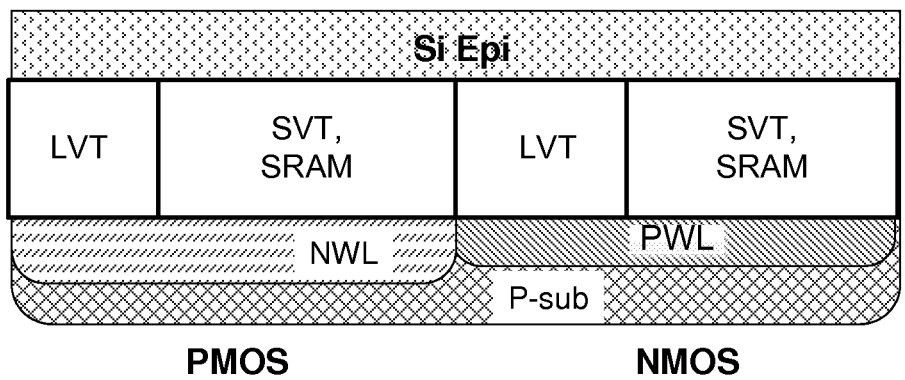

After the implants are completed for the devices within the NMOS and PMOS regions, any remaining photoresist or other mask material and any remaining sacrificial oxide should be removed to expose the semiconducting surface including the implanted regions, as shown in FIG. 3E. Thereafter, a blanket layer is formed, preferably by way of an epitaxial silicon process, as shown in FIG. 3F. As described above, the thickness of the epitaxial layer is selected so that it corresponds to the sweet spot associated with a thick epitaxial layer device. For example, for certain device targets, a silicon epitaxial layer of 25 nm can be formed. Such a layer can be deposited using an epitaxial growth process, without added dopants to modify the electrical characteristics, where the processing temperatures, the deposition time, or both are selected such that significant migration of previously implanted material is prevented. In one particular embodiment, the epitaxial growth process can utilize processing temperatures of approximately 600 C. In the embodiment at FIG. 3F, the thickness is selected such that the epitaxial layer for PMOS has the greater targeted thickness. Thus, the epitaxial layer for NMOS is to be thinned. However, the various embodiments are not limited in this regard. Rather, in other embodiments, depending on process conditions, device targets, and other factors, the epitaxial layer for NMOS may need to be thicker and the epitaxial layer for PMOS may need to be thinned.

Figure 3G:
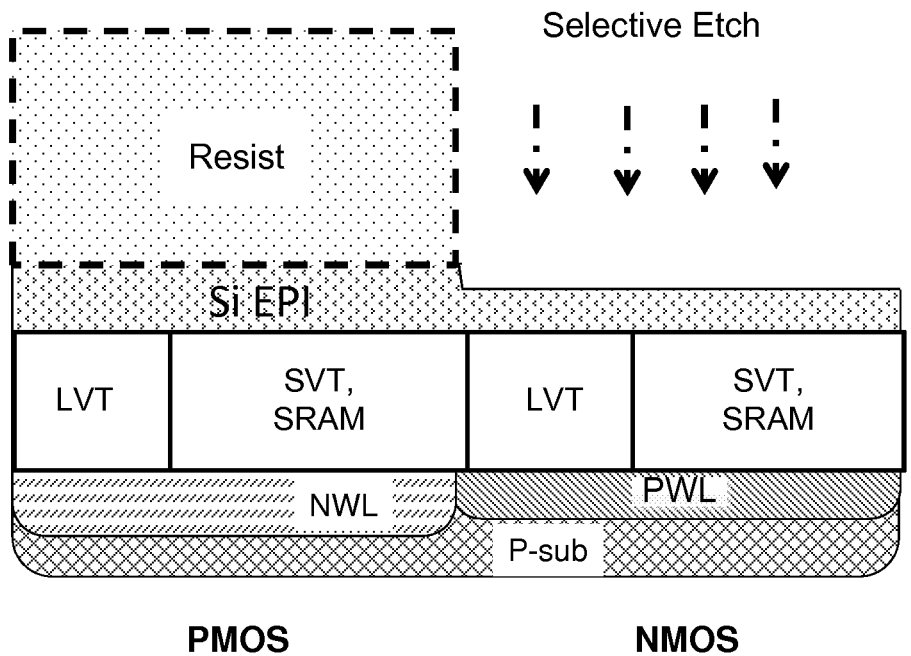

The selective thinning of the epitaxial layer for the NMOS devices can be performed as follows. First, as illustrated in FIG. 3G, a patterned masking layer can be formed to expose the NMOS regions of the semiconducting surface. Although FIG. 3G illustrates this masking layer as consisting of a single layer of photoresist, the various embodiments are not limited in this regard. In other configurations, the masking layer can consist of a hard mask, separately or in combination with the photoresist layer. Such a hard mask can be a layer of silicon oxide, silicon nitride, or any other material which will be resistant to the removal process to be used for the epitaxial layer.

As noted above, a thinner epitaxial layer thickness is required for the NMOS devices. Accordingly, the patterned masking layer includes an opening over the NMOS regions, as shown in FIG. 3G. Once the pattern is formed, a selective removal process is utilized to reduce the thickness of the epitaxial layer. As used herein, the term "selective removal process" refers to any type of removal process that preferentially removes one type of material over another type of material. This can include, but is not limited to, any type of wet or dry, chemical, physical, or plasma-based etch processes for removing materials. In the case of FIG. 3G, the selective removal process would be configured to preferentially remove silicon over photoresist material. As noted above, the specific process for the selective removal process can vary depending on the amount of material to be removed and the amount of epitaxial layer thickness variability permitted.

Figure 3H:
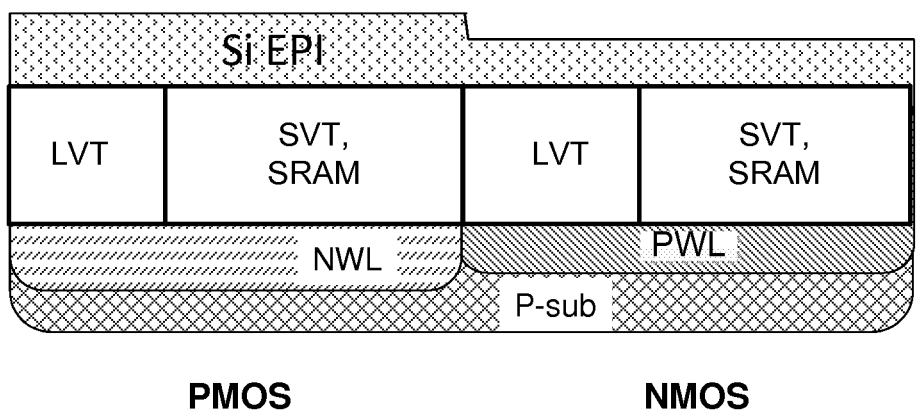

In the exemplary process shown in FIG. 3G, a dry etch process is utilized to target a removal of 2 nm of the 25 nm silicon epitaxial layer in the NMOS region. However, this is presented solely for illustrative purposes and not by way of limitation. As noted above, the amount of the epitaxial layer thinning can vary depending on various factors. Accordingly, in the various embodiments the amount of epitaxial layer removed can be more or less than shown in FIG. 3G. After the selective removal process is performed, the photoresist or other masking layer can be removed to expose the surfaces of the semiconducting surface, as shown in FIG. 3H.

Figure 3I:
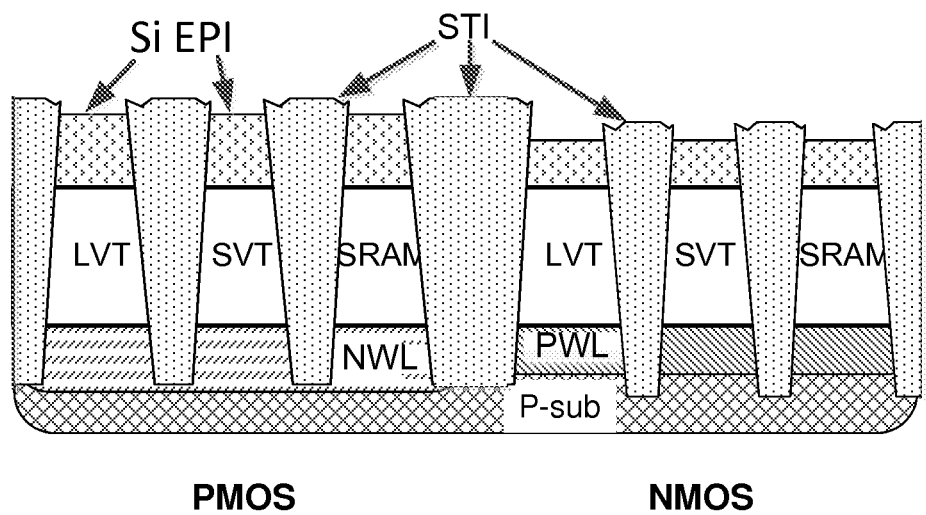

The present disclosure contemplates that as part of the process of forming devices in active area or regions of the semiconducting surface, some type of active area isolation is provided. For example, shallow trench isolation (STI) or any other types of active area isolation techniques can be used with the various embodiments, provided that care is taken to achieve or maintain the specified epitaxial layer thickness for the various devices. For example, as shown in FIG. 3I, STI features can be formed after selective etching of the epitaxial layer to define separate active areas for the SVT, LVT, and SRAM devices in the PMOS and NMOS regions. Following the formation of these isolation features, processing of the substrate can then continue on to complete the transistor devices in the PMOS and NMOS regions.

Although FIGS. 3A-3I illustrate a process showing selective thinning of epitaxial layer thickness in a single region of the epitaxial layer, the various embodiments are not limited in this regard. Rather, as noted above, a process in accordance with the various embodiments can result in the selective thinning of epitaxial layer thickness in any number of regions, where each region is of a different epitaxial layer thickness. Further, as also noted above, such regions can be formed concurrently or separately.

Further, FIGS. 3A-3I illustrate the formation of active areas and thinning of epitaxial layer thicknesses, where the thinning of the epitaxial layer occurs prior to a formation of active area isolation features. However, the present disclosure contemplates that in the various embodiments, the selective thinning of the epitaxial layer can occur before or after formation of the active area isolation features. In some cases, both of these types of selective thinning can occur. For example, if the process reaches the structure shown in FIG. 3I and the characteristics of one or more of active area regions define by the isolation features are incorrect or out of specification (e.g., due to errors or process variations), additional thinning can be applied to adjust the epitaxial layer in these active area regions prior to additional processing. Thus, the wafers including such device regions can potentially be salvaged.

As shown in FIGS. 3G-3I, a consequence of the process flow of the various embodiments is that the height of the epitaxial silicon layer will vary across the surface of the substrate. In the case where STI was formed prior to the selective thinning, the STI to epitaxial layer step height may also vary across the surface of the substrate. Depending on the process node, the fabrication line, and other production factors, these height variations can cause issues during subsequent processing. The present disclosure contemplates several extensions of the process flow to address these issues. In cases where the height differences in the epitaxial silicon layer are an issue, the present disclosure contemplates performing a selective thinning of the substrate in areas where a thicker epitaxial layer is to be defined. Thereafter, the subsequent selective thinning would reduce or eliminate the difference between such varying surface heights. Similarly, in cases where the STI to epitaxial layer step height is an issue the present disclosure contemplates performing a selective thinning of the STI in affected areas.

The present disclosure contemplates that the combination of epitaxial layer thicknesses and doped regions for the various devices in a mixed device die can be obtained in a variety of ways. One methodology is to determine the conditions using simulation tools. For example, a technology computer aided design (TCAD) program can be utilized to model the desired operation of the devices in the mixed device die. This modeling can be used to determine the proper epitaxial layer thicknesses and implant conditions for the Vth values for the various types of devices. Such fabrication conditions can be based on pre-defined target device characteristics and other considerations. For example, the simulation process can consider pre-defined doping conditions and criteria for differences in the epitaxial layer thickness. Further, such processes can be performed iteratively. In one exemplary embodiment, the simulation process can proceed as shown in FIG. 4.

Figure 4:
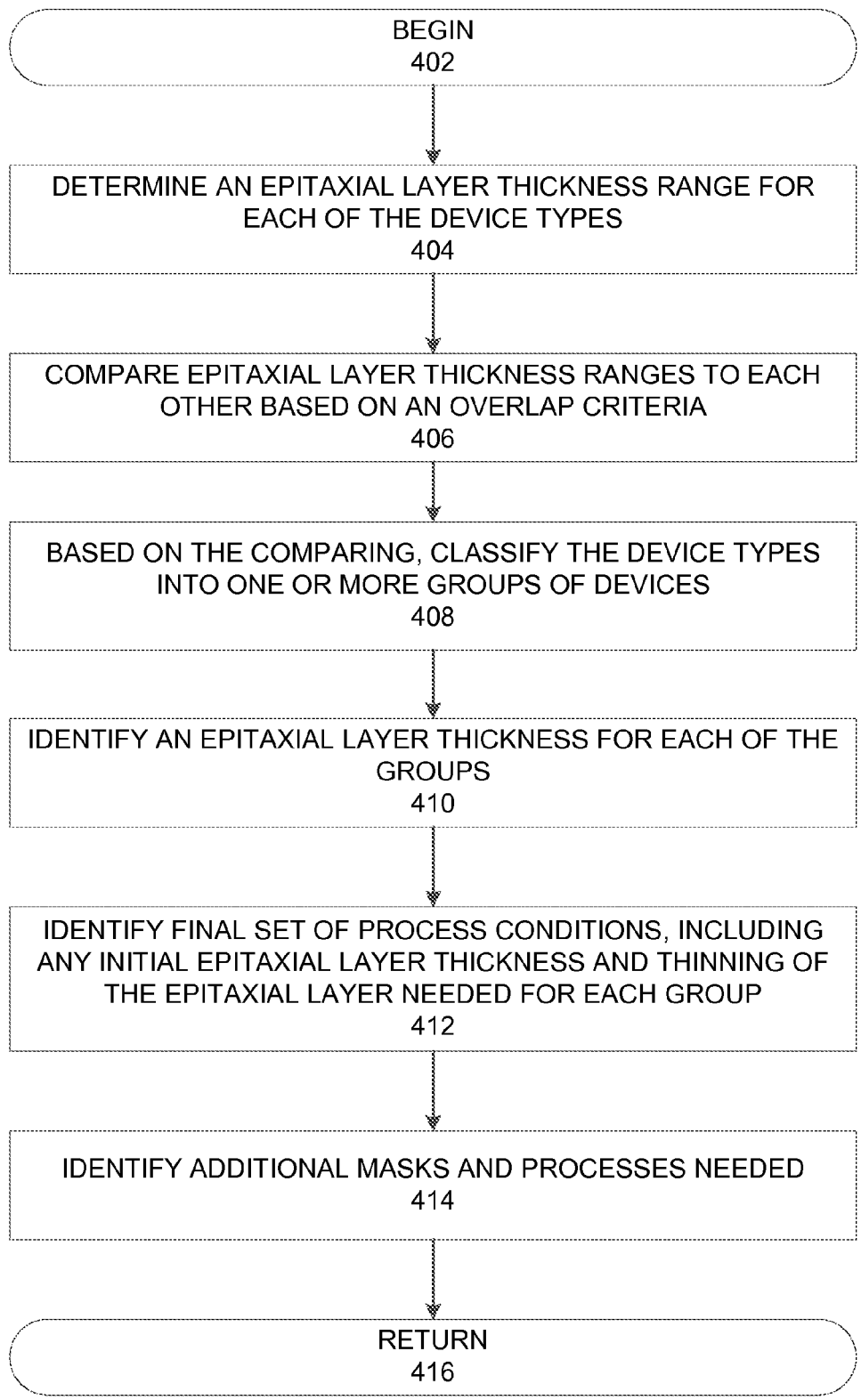
FIG. 4 is a flowchart of steps in an exemplary method 400 for a simulation process in accordance with the various embodiments.

FIG. 4 is a flowchart of steps in an exemplary method 400 for a simulation process in accordance with the various embodiments. Method 400 begins at step 402 and proceeds to step 404. At step 404, based on the pre-defined device characteristic targets, for an assumed set of doping conditions, an epitaxial layer thickness range for each device type can be determined, where the epitaxial layer thickness range identifies the range of epitaxial layer thicknesses in which the device type will meet the pre-defined device characteristic targets. As discussed above, the device characteristic targets can include Vth targets, leakage current targets, substhreshold swing target, and drain-induced barrier lowering targets, to name a few. However, the various embodiments are not limited in this regard and any other type of device characteristic targets can be utilized in the various embodiments. Further, the present disclosure also contemplates that for different types of devices, different types of device characteristic targets can be selected.

Thereafter, at step 406, the epitaxial layer thickness ranges for the various devices can be compared to each other to determine where they overlap and whether the overlap meets a pre-defined thickness overlap criteria. In other words, the epitaxial layer thickness range for one device type is compared to the epitaxial layer thickness ranges for each other type of device to determine whether there is sufficient overlap in the epitaxial layer thickness ranges to utilize a common epitaxial layer thickness for the one device type and one or more of the other device types in the mixed device dies. Once such comparisons are made, the method then proceeds to step 408.

At step 408, the comparison at step 406 is utilized to classify the device types into groups. That is, the device types are divided into groups of device types with epitaxial layer thickness ranges that all meet the overlap criteria with respect to each other. As an illustrative example, assume that the overlap criteria require at least some minimum overlap in the sweet spot range. Accordingly, applying this overlap criteria to the device types in FIG. 1, step 406 would identify the LVt and SVt PMOS logic device types as meeting this criteria, the LVt and SVt NMOS logic device types as meeting this criteria, and the 1.8V and 3.3V analog devices as meeting this criteria. Thus, at step 408, the groups can be a group consisting of the PMOS logic devices, a group consisting of the NMOS logic device, and a group consisting of the analog devices.

The present disclosure contemplates that in the event that a device type can potentially fall into two or more groups and a group for the device type can be selected based on additional criteria or rules. For example, an additional rule can specify selecting a group based on a higher degree of overlap. In another example, an additional rule can specify selecting a group so as to minimize the total number of groups. Any other criteria can also be applied without limitation.

Referring back to FIG. 4, once the groups of device types are identified at step 408, the method 400 can proceed to step 410. At step 410, the epitaxial layer thickness for each group can be identified. The epitaxial layer thickness can be selected in various ways. In one example, the thicknesses for each group can be selected so that the resulting thicknesses, after subsequent processing, will be at or near the sweet spot for the device types in each of the groups. In another example, the epitaxial layer thicknesses can be selected such that the range for the epitaxial layer thickness across all the groups is within the tolerance limits for lithography and other fabrication steps that can be impacted by variations planarity across the substrate.

Subsequent to step 410, the method 400 proceeds to step 412 where a final set of process conditions is identified, including an initial epitaxial layer thickness needed for the mixed device die, the number of selective epitaxial layer thinning steps needed, and any adjustments required for the implant conditions.

Finally, at step 414, additional masks or processes needed to support the process conditions at step 412 are identified and incorporated into the process flow. This step can include automatically adjusting the integrated circuit design to insert design blocks associated with areas in which epitaxial layer thinning is to occur.

Optionally, the design flow above can be modified to simplify the process flow. As noted above, the variation in epitaxial layer thickness can have a significant effect on at least Vth values for DDC devices. Accordingly, some of the implants utilized in more conventional process flows may not be needed if the desired device characteristics can be obtained based on a modulation of epitaxial layer thickness. Therefore, in some embodiments, the simulation process can be configured to determine whether selective thinning of the epitaxial layer can be performed in combination with one or more implant adjustments to reduce or eliminate the need for one or more implants. For example, the simulation can identify epitaxial layer thicknesses at which particular implants, such as halo or channel implants, can be eliminated. The simulation can further identify whether an adjustment of other implants, such as screen layer implants, would be needed in combination with selective thinning of the epitaxial layer. In some cases, this analysis can be performed regardless of whether or not the overlap criteria are met.

Another method is to base adjustments to the process flow, at least partially, on empirical data. That is, mixed device die can be manufactured using various conditions for both epitaxial layer thickness and implants. Thereafter, the conditions for each type of device can be selected based on the performance of the resulting devices and pre-defined target device characteristics for the different types of devices. If necessary, additional mask layers can be inserted if additional implants or selective etchings are needed. In such embodiments, the empirical data can be used to establish a model, a relationship, or other function correlating epitaxial layer thickness and device characteristics, such as Vth, for various implant conditions. Such relationships can be used directly to compute or calculate an epitaxial layer thickness (or reduction) needed to meet particular device characteristic targets. Alternatively, such relationships can be used to generate tables or other data for look-up purposes.

The design flow can also involve a determination of how to minimize the number of selective thinning steps. That is, it may be possible to provide a same epitaxial layer thickness for two different types of devices, where each is in their respective sweet spot. This can involve identifying whether one or more implants can be adjusted to shift the sweet spot for one or both types of devices. Alternatively, this can involve determining whether the target device characteristics for one or both of the devices are sufficiently flexible in order to consider a wider range of epitaxial layer thickness and implant adjustments.

Although the various embodiments have been primarily described with respect to designing devices with an amount of selective thinning in mind, the present disclosure contemplates other uses. In particular, the selective thinning of the various embodiments can also be of use during processing to reduce scrap and improve yield. Specifically, the selective thinning of the various embodiments can be used to adjust Vth (or other device characteristics) during processing due to fabrication error or process variation. For example, if the resulting doping concentrations in a substrate after active area implant (i.e., implants prior to gate formation) are expected to result in devices with Vth characteristics that are out of specification, such a substrate would normally be scrapped. This results in degraded yields and additional costs to the manufacturer. However, the present disclosure contemplates that the various embodiments can be utilized to salvage such substrates. In particular, if a reduction of the epitaxial layer thickness can be used to provide a sufficient adjustment of Vth to provide device in specification, then a selective thinning process in accordance with the various embodiments can be used to salvage such substrates. In such cases, a manufacturing facility can be equipped with additional mask levels for the circuit design that can be used to implement such corrections. For the actual processing, the amount of epitaxial layer thickness reduction can be computed or looked up for the particular process flow. Alternatively, any additional mask levels can be designed and manufactured as needed.

For ease of illustration, the various embodiments have been described primarily with respect to DDC devices. However, the various embodiments are not limited in this regard. Rather selective thinning of a semiconducting surface can be performed on non-DDC devices in a substantially similar manner. That is, the various embodiments are equally useful for adjusting any other type of mixed device die in which modulation of the thickness of a common semiconducting layer would benefit one or more device types on a mixed device die. Embodiments can be used on mixed device die including PMOS channels or analog devices defined using silicon germanium (SiGe) alloys devices or other heterostructures. For example, if a mixed device die includes different types of SiGe PMOS or SiGe analog devices, it may be beneficial, for purposes of performance, to provide some selective thinning of the SiGe rather than relying on a single thickness of SiGe for the different types of devices. However, the various embodiments are not limited in this regard and methods described herein can be used to modulate other types of semiconducting layers.

Further, although the selecting thinning of the various embodiments has been described with respect to a process including deposition of the epitaxial layer followed by selective etching or removal of the epitaxial layer to locally reduce epitaxial layer thickness, the various embodiments are not limited in this regard. The present disclosure contemplates that the selective Vth modulation can be achieved by way of targeting the devices that call for a thinner epitaxial layer and forming the epitaxial layer accordingly, then, use a selective epitaxial layer formation process to locally and selectively build-up the epitaxial layer thickness for those devices that call for thicker epitaxial layer. In particular embodiments, such a process can involve forming a first, blanket epitaxial layer, as described above. Thereafter, in areas requiring a thicker epitaxial layer (in order to target a lower Vth) at least one second epitaxial layer can be formed, by masking the areas to remain as-is and selectively growing an epitaxial layer in the open areas, to locally increase the thickness of the epitaxial layer to effect a reduced Vth. These selective epitaxial layer formation processes can therefore be used, alternatively or in combination with the selective etching processes described above, to achieve the desired modulation of epitaxial layer thickness and consequent Vth modulation of the various embodiments.

EXAMPLES

The examples shown here are not intended to limit the various embodiments. Rather they are presented solely for illustrative purposes. In particular, the following examples are provided to illustrate results supporting the various concepts described above.

Figure 5:
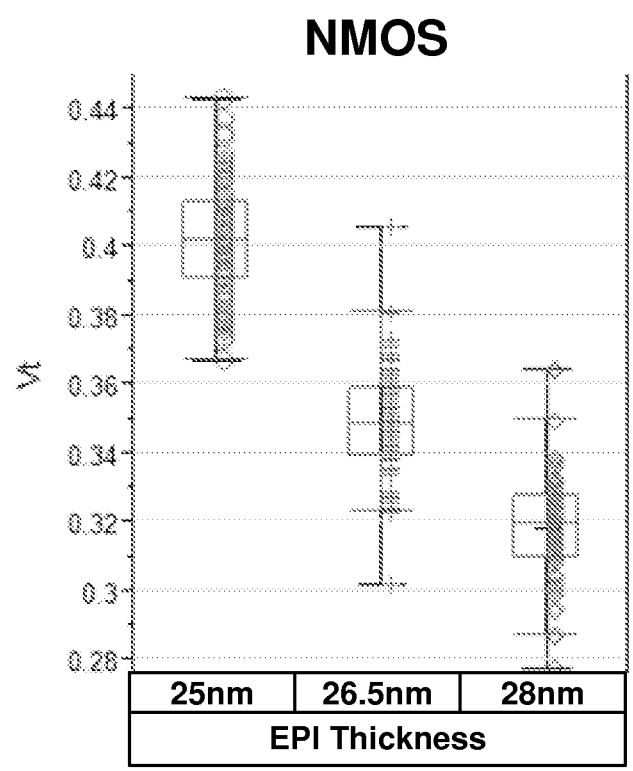
FIG. 5 is a plot of measured Vth versus target epitaxial layer thickness for NMOS devices.

The relationship between Vth and epitaxial layer thickness is illustrated in FIG. 5. FIG. 5 is a plot of measured Vth versus target epitaxial layer thickness for the same screen/Vth region doping levels for 65 nm node NMOS DDC devices. As shown in FIG. 5, as epitaxial layer thickness is decreased, Vth is increased. The relationship between epitaxial layer thickness correlates with Vth in that the thicker the epitaxial layer, the lower the Vth. This is illustrated in the NMOS data showing a mid-point Vth shift of approximately 80 mV for a 3 nm change in epi thickness. Selective adjustment of epitaxial layer thickness provides an effective and reliable tool for fine Vth adjustment.

A further example of the potential benefit using different epitaxial layer thicknesses for different DDC devices is illustrated in FIG. 6. In particular, FIG. 6 lists different exemplary specifications for NMOS and PMOS DDC devices, specifically, analog 3.3V devices, analog 1.8V devices, and 0.9V logic devices the results of simulating corresponding DDC devices with epitaxial layer thicknesses at 25 nm and 30 nm. First, with respect to the analog 3.3V devices, DDC devices at 25 nm result in Vth values that exceed the exemplary specification. However, by increasing the epitaxial layer thickness to 30 nm (5 nm thicker), the Vth values for such DDC devices are brought down to values at or near the exemplary specification. A similar result is observed with respect to the 1.8V DDC devices. With respect to the 0.9V logic devices, the opposite occurs. That is, devices with a 25 nm epitaxial layer thickness result in Vth values that meet the exemplary specification while devices with the thicker 30 nm epitaxial layer thickness result in devices having a Vth that fails to meet the exemplary specification. Based on the foregoing, one could configure the fabrication process to form a 30 nm epitaxial layer and thereafter apply a 5 nm thinning of epitaxial layer thickness for the 0.9V DDC devices. Such a combination would then result in all of the analog 3.3V devices, analog 1.8V devices, and 0.9V logic devices meeting their respective specification solely with an adjustment of epitaxial layer thickness in the 0.9V logic devices.

As noted above, the variation in epitaxial layer thickness can also be used to adjust other device parameters. Examples of the effect of epitaxial layer thickness on such other device parameters is shown in FIGS. 7, 8A, 8B, 9A, and 9B.

Figure 7:
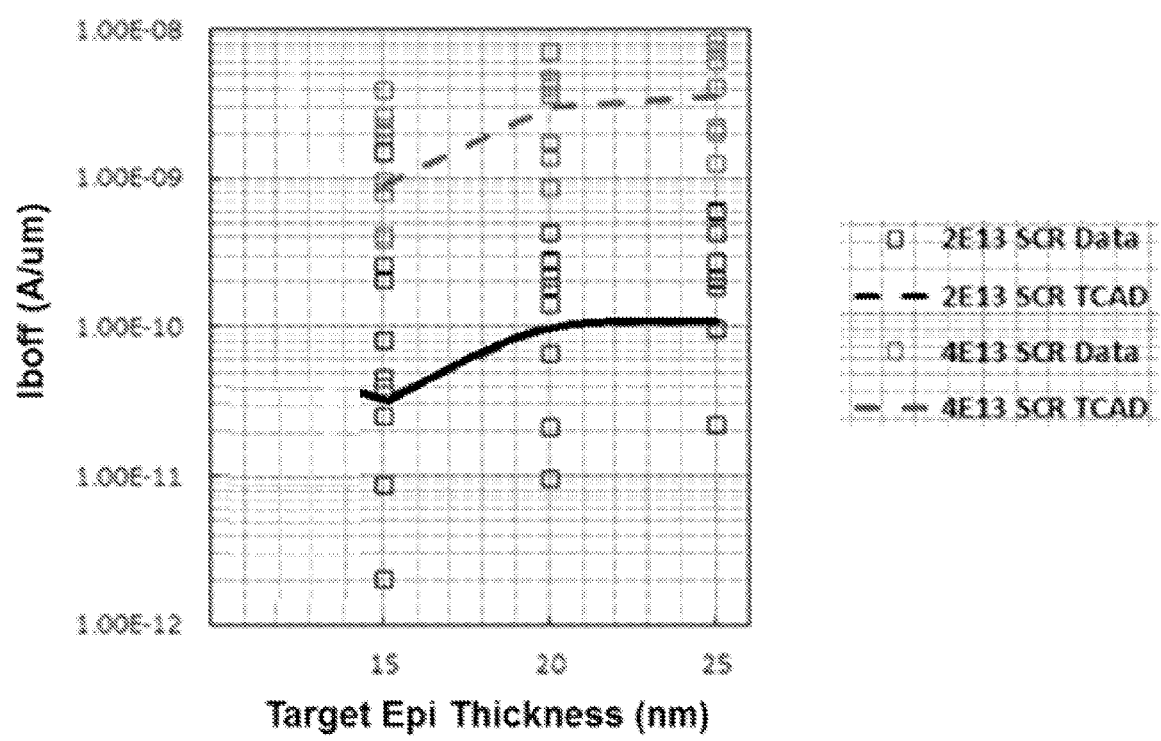
FIG. 7 is a plot of leakage current (Iboff), simulated and measured, as a function of epitaxial layer thickness.

FIG. 7 is a plot of leakage current (Iboff), simulated and measured, as a function of epitaxial layer thickness. Specifically, results are shown for DDC devices with different screen implant conditions (doses of $2 \times 10^{13}$ cm$^{-2}$ and $4 \times 10^{13}$ cm$^{-2}$). Regardless of dose, the simulated and measured results show that as epitaxial layer is reduced, Iboff is also reduced. Similar results are observed in FIGS. 8A, 8B, 9A, and 9B.

Figure 8A:
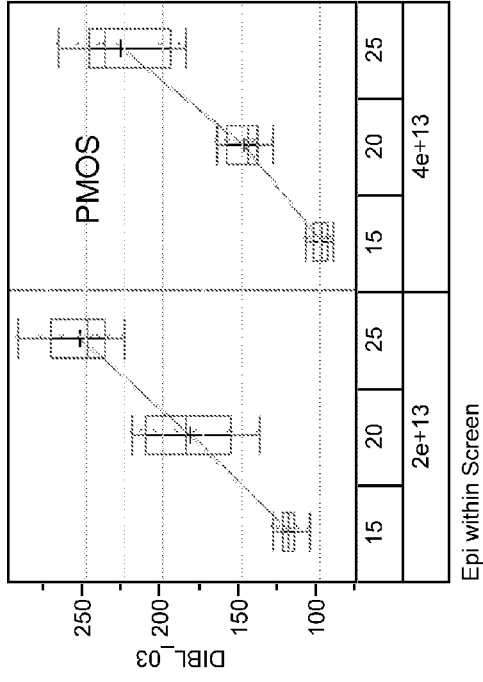
FIGS. 8A and 8B are plots of drain-induced barrier lowering (DIBL) as a function of epitaxial layer thickness for NMOS and PMOS devices, respectively.
Figure 8B:
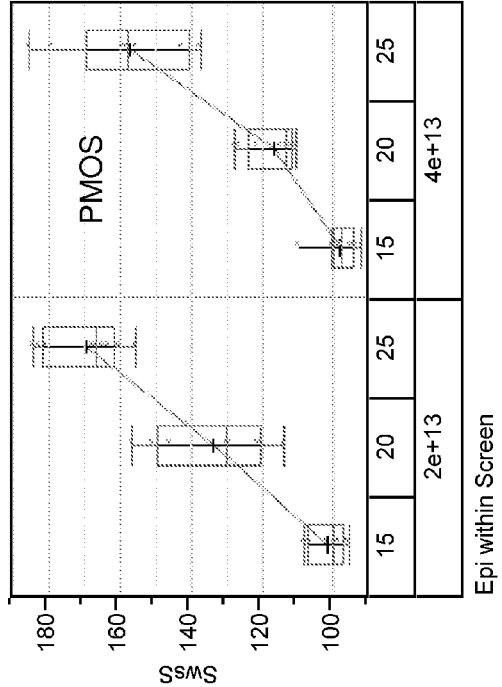

FIGS. 8A and 8B are plots of drain-induced barrier lowering (DIBL) as a function of epitaxial layer thickness for NMOS and PMOS devices, respectively. Again, results are shown for DDC devices with different screen implant conditions (doses of $2\times10^{13}$ cm$^{-2}$ and $4\times10^{13}$ cm$^{-2}$). Regardless of dose, the results show that as epitaxial layer is reduced, DIBL is also reduced.

Figure 9A:
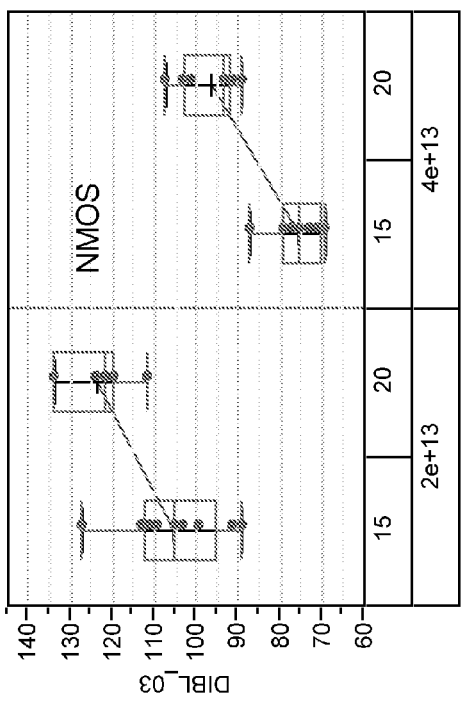
FIGS. 9A and 9B are plots of subthreshold swing (SwsS) as a function of epitaxial layer thickness for NMOS and PMOS devices, respectively.
Figure 9B:
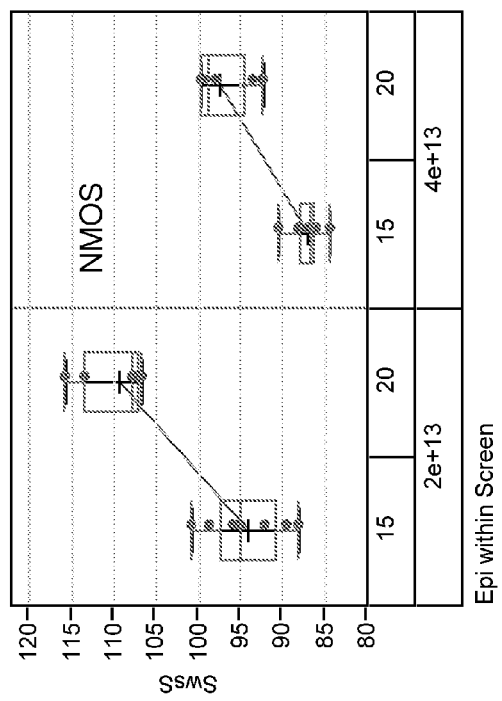

FIGS. 9A and 9B are plots of subthreshold swing (SwsS) as a function of epitaxial layer thickness for NMOS and PMOS devices, respectively. These results are also for DDC devices with different screen implant conditions (doses of $2\times10^{13}$ cm$^{-2}$ and $4\times10^{13}$ cm$^{-2}$). Again, regardless of dose, the results show that as epitaxial layer is reduced, SwsS is also reduced.

The foregoing examples illustrate the two significant advantages of the present invention. First, as noted above with respect to FIG. 5 and as shown in FIGS. 6, 7, 8A, 8B, 9A, and 9B there is a strong correlation between epitaxial layer thickness and various device characteristics, including Vth. Specifically, as epitaxial layer thickness for a device is increased, the Vth value for the device is decreased, and vice versa. Other device characteristics show similar relationships. Therefore, a first advantage is that epitaxial layer thinning can be utilized to directly and controllably modify Vth or other device characteristics, with little or no changes to implant processes or any other process steps that significantly affect these device characteristics. Second, the advantage of selective epitaxial layer thinning is clearly illustrated. In particular, FIG. 6 shows that is selective thinning is applied to the epitaxial layer for different types of devices, the Vth for different device types can be tuned while keeping within a dopant concentration range.

Figure 10:
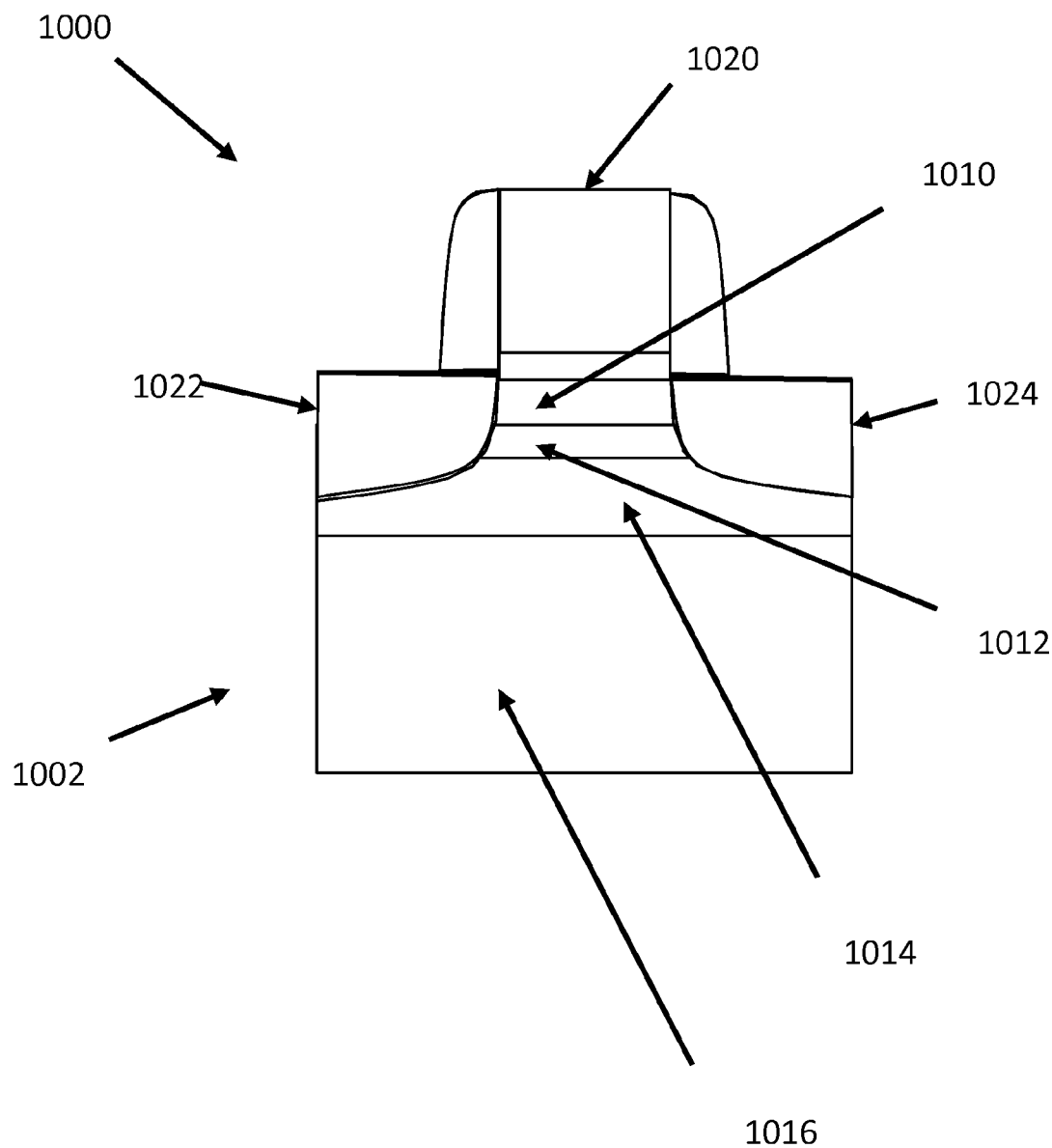
FIG. 10 shows a schematic diagram of a completed DDC transistor in accordance with the various embodiments.

FIG. 10 shows a schematic diagram of a completed DDC transistor 1000 in accordance with the various embodiments. FIG. 10 shows that the completed DDC transistor 1000 can have a wafer well 1002 that can be implanted with both an antipunchthrough layer 1016 and heavily doped, defined thickness screening layer 1014. An undoped epitaxial layer supports a channel 1010 positioned beneath a gate 1020 and between a source 1022 and drain 1024. An optional intermediate (or offset) threshold voltage set layer 1012 can be outdiffused from the screening layer 1014, or alternatively, formed by in situ or implantation of a grown silicon epitaxial layer on the screening layer 1014. The epitaxial layer can be implanted or grown as a blanket layer across the die, and be selectively doped to have various channel dopant profiles deposited on a wafer over the screening layer.

While various embodiments have been described above, it should be understood that they have been presented by way of example only, and not limitation. The breadth and scope of the present invention should not be limited by any of the above described embodiments. Rather, the scope of the invention should be defined in accordance with the following claims and their equivalents.

Although the embodiments have been illustrated and described with respect to one or more implementations, equivalent alterations and modifications will occur to others skilled in the art upon the reading and understanding of this specification and the annexed drawings. In addition, while a particular feature of an embodiment may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A semiconductor chip, comprising:
a substrate having a semiconducting surface comprising a first layer formed directly on a second layer, the semiconducting surface having formed therein a plurality of active regions extending through the first layer and the second layer, the plurality of active regions comprising at least a first active region and a second active region, the first layer comprising a substantially undoped layer, and the second layer comprising a highly doped screening layer, a first gate insulating film formed directly on the first layer in the first active region, a second gate insulating film formed directly on the first layer in the second active region; and
a first semiconductor device comprising the first gate insulating film formed in the first active region and a second semiconductor device comprising the second gate insulating film formed in the second active region,
wherein a thickness of the first layer in the first active region and a thickness of the first layer in the second active region are different, wherein a thickness of the second layer in the first active region and a thickness of the second layer in the second active region are substantially the same, wherein a position of a boundary between the first layer and the second layer for each of the first active region and the second active region is substantially the same throughout the substrate, and wherein the first layer in the first active region and the first layer in the second active region are common undoped epitaxial layer of a single semiconductor material.

2. The semiconductor chip of claim 1, wherein the semiconductor material is silicon.

3. The semiconductor chip of claim 1, wherein a difference between the thickness of the first layer in the first active region and a thickness of the first layer in the second active region is between about 1 nm and 10 nm.

4. The semiconductor chip of claim 1, wherein a difference between the thickness of the first layer in the first active region and a thickness of the first layer in the second active region is between about 1 nm and 5 nm.

5. The semiconductor chip of claim 1, further comprising trench regions separating the plurality of active regions, the trench regions being filled with an electrical insulator material, wherein a step height between the electrical insulator material in the trench regions and adjacent portions of the semiconducting surface is substantially the same across the substrate.

6. The semiconductor chip of claim 1, wherein the first active region and the second active region are active regions of a same conductivity type, wherein a dopant concentration in the second layer is substantially the same in the first active region and the second active region, wherein:

the first and the second gate structures having substantially identical properties, and wherein at least one electrical characteristic of the first semiconductor device and the second semiconductor device is different.

7. The semiconductor ship of claim 6, wherein the at least one electrical characteristic comprises at least one of a threshold voltage target, a leakage current target, a subthreshold swing target, or a drain-induced barrier lowering target.

\* \* \* \* \*